United States Patent
Myung et al.

(10) Patent No.: US 10,389,382 B2
(45) Date of Patent: Aug. 20, 2019

(54) TRANSMITTER AND SIGNAL PROCESSING METHOD THEREOF

(71) Applicant: SAMSUNG ELECTRONICS CO., LTD., Suwon-si (KR)

(72) Inventors: Se-ho Myung, Yongin-si (KR); Hong-sil Jeong, Suwon-si (KR); Kyung-joong Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 362 days.

(21) Appl. No.: 14/489,851

(22) Filed: Sep. 18, 2014

(65) Prior Publication Data

US 2015/0082117 A1    Mar. 19, 2015

Related U.S. Application Data

(60) Provisional application No. 61/882,731, filed on Sep. 26, 2013, provisional application No. 61/882,161, (Continued)

(30) Foreign Application Priority Data

May 21, 2014    (KR) .................. 10-2014-0061096

(51) Int. Cl.
  *H04L 1/00*    (2006.01)
  *H03M 13/11*   (2006.01)
  (Continued)

(52) U.S. Cl.
  CPC ..... *H03M 13/116* (2013.01); *H03M 13/2757* (2013.01); *H03M 13/6362* (2013.01);
  (Continued)

(58) Field of Classification Search
  CPC .......................... H04L 5/0007; H04L 1/0057; H04L 27/2602; H04L 27/2627; H04L 27/2649;
  (Continued)

(56) References Cited

U.S. PATENT DOCUMENTS

2009/0063929 A1*  3/2009  Jeong ................. H03M 13/1165
                                                714/752
2009/0259913 A1  10/2009  Myung et al.
(Continued)

FOREIGN PATENT DOCUMENTS

EP    2157756 A1    2/2010
EP    2541911 A2    1/2013
(Continued)

OTHER PUBLICATIONS

Digital Video Broadcasting (DVB); Frame structure channel coding and modulation for a second generation digital terrestrial television broadcasting system (DVB-T2), Apr. 2012, ETSI, v1.3.1, pp. 40-45.*
(Continued)

*Primary Examiner* — April Y Blair
*Assistant Examiner* — Sazzad Hossain
(74) *Attorney, Agent, or Firm* — Sughrue Mion, PLLC

(57) ABSTRACT

A transmitter, a receiver and methods of controlling the transmitter and the receiver are provided. The transmitter includes: a Low Density Parity Check (LDPC) encoder configured to generate an LDPC codeword by performing LDPC encoding on an L1 post signaling; a demux configured to demultiplex a plurality of bits constituting the L1 post signaling of the LDPC codeword; and a modulator configured to modulate the demultiplexed bits.

17 Claims, 15 Drawing Sheets

Related U.S. Application Data filed on Sep. 25, 2013, provisional application No. 61/879,251, filed on Sep. 18, 2013.

(51) Int. Cl.
| | | |
|---|---|---|
| *H03M 13/27* | (2006.01) | |
| *H03M 13/00* | (2006.01) | |
| *H03M 13/25* | (2006.01) | |
| *H04L 27/26* | (2006.01) | |
| *H04L 5/00* | (2006.01) | |
| *H03M 13/15* | (2006.01) | |
| *H03M 13/29* | (2006.01) | |

(52) U.S. Cl.
CPC ..... *H03M 13/1105* (2013.01); *H03M 13/1111* (2013.01); *H03M 13/152* (2013.01); *H03M 13/255* (2013.01); *H03M 13/2906* (2013.01); *H04L 1/0057* (2013.01); *H04L 5/0007* (2013.01); *H04L 27/2602* (2013.01); *H04L 27/2627* (2013.01); *H04L 27/2649* (2013.01)

(58) Field of Classification Search
CPC ........... H03M 13/255; H03M 13/1105; H03M 13/6362; H03M 13/116; H03M 13/2757; H03M 13/2906; H03M 13/152; H03M 13/1111
USPC .................................................. 714/758, 776
See application file for complete search history.

(56) References Cited

U.S. PATENT DOCUMENTS

| | | | | |
|---|---|---|---|---|
| 2010/0306627 | A1* | 12/2010 | Sakai ................... | H03M 13/116 714/781 |
| 2011/0276855 | A1* | 11/2011 | Jeong .................. | H03M 13/033 714/752 |
| 2012/0284583 | A1 | 11/2012 | Tran et al. | |
| 2013/0235952 | A1 | 9/2013 | Ko et al. | |
| 2013/0243116 | A1 | 9/2013 | Ko et al. | |
| 2015/0089320 | A1* | 3/2015 | Jeong .................. | H03M 13/255 714/758 |

FOREIGN PATENT DOCUMENTS

| | | |
|---|---|---|
| WO | 2011105754 A2 | 9/2011 |
| WO | 2012070837 A2 | 5/2012 |

OTHER PUBLICATIONS

Search Report dated Dec. 22, 2014, issued by the International Searching Authority in counterpart International Application No. PCT/KR2014/008717.

Written Opinion dated Dec. 22, 2014, issued by the International Searching Authority in counterpart International Application No. PCT/KR2014/008717.

* cited by examiner

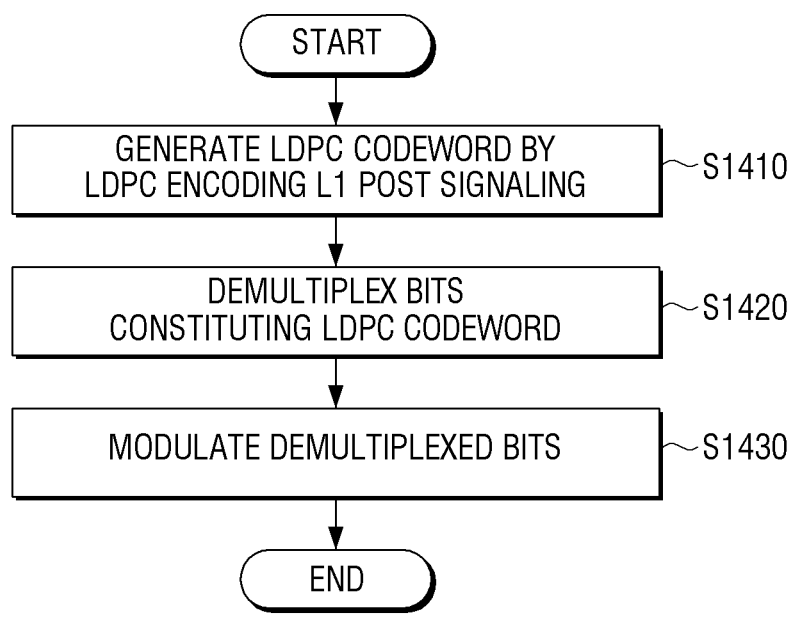

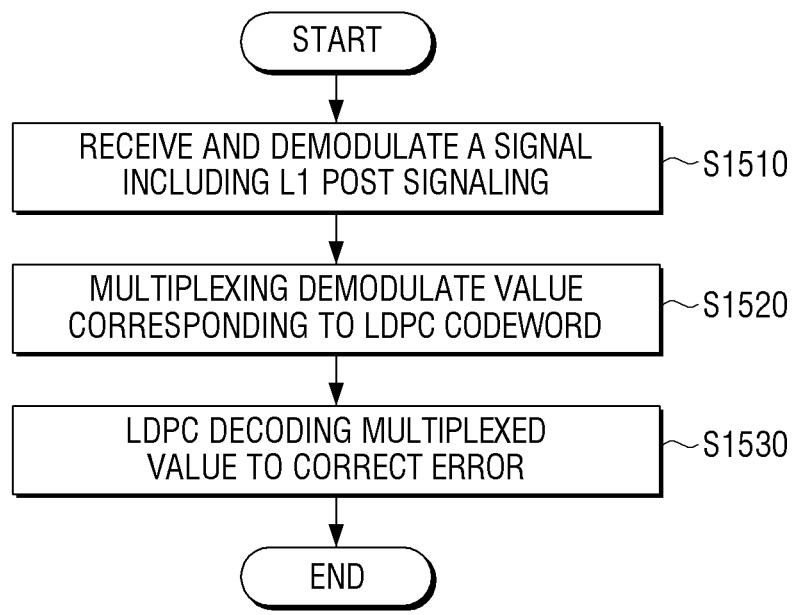

TRANSMITTER AND SIGNAL PROCESSING METHOD THEREOF

CROSS-REFERENCE TO RELATED APPLICATIONS

This application claims priority from U.S. Provisional Application No. 61/879,251 filed on Sep. 18, 2013, U.S. Provisional Application No. 61/882,161 filed on Sep. 25, 2013, and U.S. Provisional Application No. 61/882,731 field on Sep. 26, 2013, in the United States Patent and Trademark Office, and Korean Patent Application No. 10-2014-0061096 field on May 21, 2014, in the Korean Intellectual Property Office, the disclosures of which are incorporated herein in their entirety by reference.

BACKGROUND

1. Field

Apparatuses and methods consistent with exemplary embodiments relate to a transmitter and a signal processing method thereof, and more particularly, to a transmitter which processes L1 post signaling and a signal processing method thereof.

2. Description of the Related Art

In the 21st century information-oriented society, broadcasting communication services are moving into the era of digitalization, multi-channel, broadband, and high quality. In particular, as high quality digital televisions and portable multimedia players (PMPs) and portable broadcasting devices are increasingly used in recent years, there is an increasing demand for methods for supporting various receiving methods of digital broadcasting services.

In order to meet such demand, standard groups are establishing various standards and are providing a variety of services to satisfy users' needs. One of these standards is the digital video broadcasting the second generation European terrestrial (DVB-T2). Still, however, there is a demand for providing improved services to users with high performance.

SUMMARY

One or more exemplary embodiments may overcome the above disadvantages and other disadvantages not described above. However, it is understood that one or more exemplary embodiment are not required to overcome the disadvantages described above, and may not overcome any of the problems described above.

One or more exemplary embodiments provide a transmitter which maps a specific bit of an L1 signaling of a signal onto a specific location of a modulation symbol of the signal, and a signal processing method thereof.

According to an aspect of an exemplary embodiment, there is provided a transmitter which may include: a Low Density Parity Check (LDPC) encoder configured to generate an LDPC codeword by performing LDPC encoding on an L1 post signaling; a demux configured to demultiplex a plurality of bits constituting the L1 post signaling of the LDPC codeword; and a modulator configured to modulate the demultiplexed bits.

The LDPC encoder may perform the LDPC encoding based on a parity check matrix which is formed of an information word sub matrix and a parity sub matrix.

The information word sub matrix may include a plurality of column groups each including 360 columns, and a location of a value 1 in a first column of each of the plurality of column groups may be defined as in Table 2.

The demux may demultiplex the LDPC encoded L1 post signaling by outputting the plurality of bits constituting the LDPC encoded L1 post signaling to a plurality of sub streams.

The demux may determine the plurality of sub streams to which the plurality of bits constituting the L1 post signaling are demultiplexed based on Table 3.

According to an aspect of another exemplary embodiment, there is provided a signal processing method of a transmitter, the method may include: generating an LDPC codeword through performing LDPC encoding on an L1 post signaling by using an LDPC encoder; demultiplexing a plurality of bits constituting the L1 post signaling by using a demux; and modulating the demultiplexed bits by using a demodulator.

The generating the LDPC codeword may include performing the LDPC encoding based on a parity check matrix which is formed of an information word sub matrix and a parity sub matrix.

The information word sub matrix may include a plurality of column groups each including 360 columns, and a location of a value 1 in a first column of each of the plurality of column groups is defined as in Table 2.

The demultiplexing may include demultiplexing the LDPC encoded L1 post signaling by outputting the plurality of bits constituting the LDPC encoded L1 post signaling to a plurality of sub streams.

The demultiplexing may include determining the plurality of sub streams to which the plurality of bits constituting the L1 post signaling are demultiplexed based on Table 3.

Here, the demultiplexing may be performed such that specific bits constituting a sub stream among the plurality of sub streams are mapped onto specific locations of a cell and a modulation symbol, and thus, the modulation symbol can be generated by considering both error correction performance of bits and the detection performance of the bits constituting the modulation symbol.

According to an aspect of still another exemplary embodiment, there is provided a receiver which may include: a demodulator configured to receive and demodulate a signal including an L1 post signaling of an LDPC codeword; a multiplexer configured to multiplex a plurality of bits constituting the L1 post signaling; and an LDPC decoder configured to decode the multiplexed bits constituting the L1 post signaling.

BRIEF DESCRIPTION OF THE DRAWINGS

The above and/or other aspects will be more apparent by describing in detail exemplary embodiments, with reference to the accompanying drawings, in which:

FIGS. 14 and 15 are flowcharts to illustrate a signal processing method of a transmitter and a signal processing method of a receiver, according to exemplary embodiments.

DETAILED DESCRIPTION OF THE EXEMPLARY EMBODIMENTS

Figure 1:
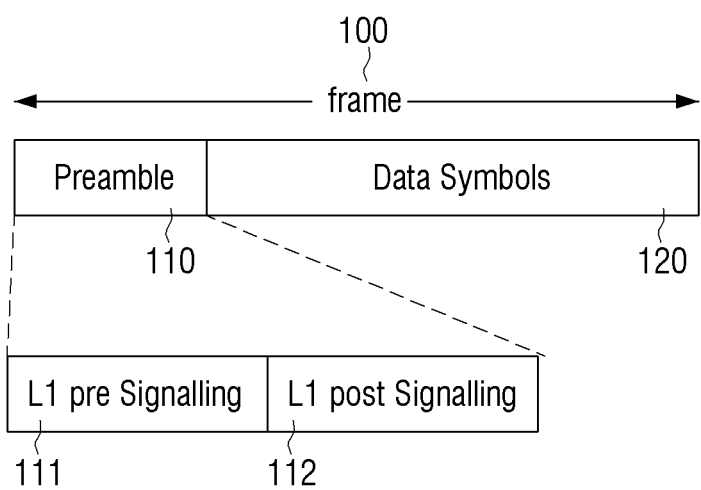
FIG. 1 is a view to illustrate a frame structure used in a related-art broadcasting/communication system.

Hereinafter, exemplary embodiments will be described in greater detail with reference to the accompanying drawings. In the following description, same reference numerals are used for the same components when they are depicted in different drawings. The matters defined in the description, such as detailed construction and components, are provided to assist in a comprehensive understanding of the exemplary embodiments. Thus, it is apparent that these exemplary embodiments can be carried out without those specifically defined matters. Also, functions or components known in the related art are not described in detail since they would obscure the exemplary embodiments with unnecessary detail.

FIG. 1 is a view to illustrate a frame structure used in a related-art broadcasting/communication system. Referring to FIG. 1, the frame 100 includes a preamble symbol 110 and data symbols 120.

The preamble symbol 110 is transmitted with an L1 signaling (or L1 signaling information) mapped thereonto. The preamble symbol 110 may be formed of an L1 pre signaling 111 (that is, L1 pre signaling information) and an L1 post signaling 112 (that is, L1 post signaling information) as shown in FIG. 1.

The L1 pre signaling 111 includes information that a receiver (not shown) requires to access the L1 post signaling 112, and the L1 post signaling 112 includes information that the receiver (not shown) requires to access a Physical Layer Pipe (PLP).

The data symbols 120 transmit broadcasting service data and may be formed of one or more PLPs. A different signal processing operation may be performed for each PLP. For example, a different modulation method and a different code rate may be used for each PLP.

As described above, a transmitter in the related-art broadcasting communication system transmits broadcasting service data in a form of the frame structure shown in FIG. 1, and a receiver obtains information on a data transmission method, a frame length, etc. through the L1 signaling and receives the broadcasting service data through the PLPs.

The exemplary embodiments relate to a method for processing the L1 post signaling of the L1 signaling and will be explained in detail below with reference to the accompanying drawings. Hereinafter, a length of an information word, a length of parity bits, and a length of a Low Density Parity Check (LDPC) codeword indicate an information word, parity bits, and the number of bits included in each LDPC codeword, respectively.

Figure 2:
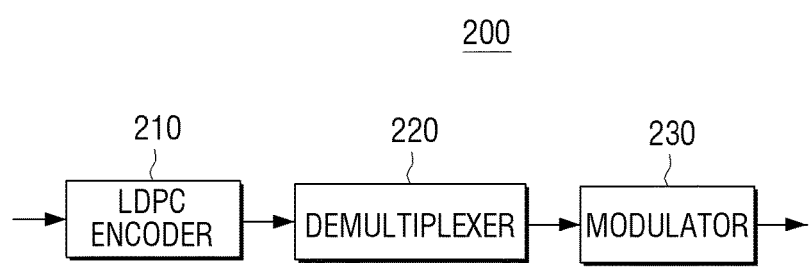
FIG. 2 is a block diagram to illustrate a configuration of a transmitter, according to an exemplary embodiment.

FIG. 2 is a block diagram to illustrate a configuration of a transmitter, according to an exemplary embodiment.

Referring to FIG. 2, the transmitter 200 includes a Low Density Parity Check (LDPC) encoder 210, a demultiplexer 220, and a modulator 230.

The LDPC encoder 210 generates an LDPC codeword (that is, LDPC-encoded bits) by LDPC-encoding an L1 post signaling.

Specifically, the LDPC encoder 210 may generate the LDPC codeword by LDPC-encoding input bits as an information word. Herein, the input bits may be an L1 post signaling.

In this case, since an LDPC code for LDPC-encoding is a systematic code, the information word may be included in the LDPC codeword as it is. That is, the LDPC encoder 210 LDPC-encodes the input bits as the information word, and the LDPC codeword generated by LDPC encoding includes the input bits which are the information word as they are, and may take a form in which LDPC parity bits are added to the information word.

Since the LDPC encoding process is a process of generating an LDPC codeword to satisfy $H \cdot C^T = 0$, the LDPC encoder 210 may use a parity check matrix for LDPC encoding. Here, H is a parity check matrix, and C is an LDPC codeword. In this case, the parity check matrix H may include an information word sub matrix and a parity sub matrix.

Hereinafter, a parity check matrix according to an exemplary embodiment will be explained in detail.

Figure 3:
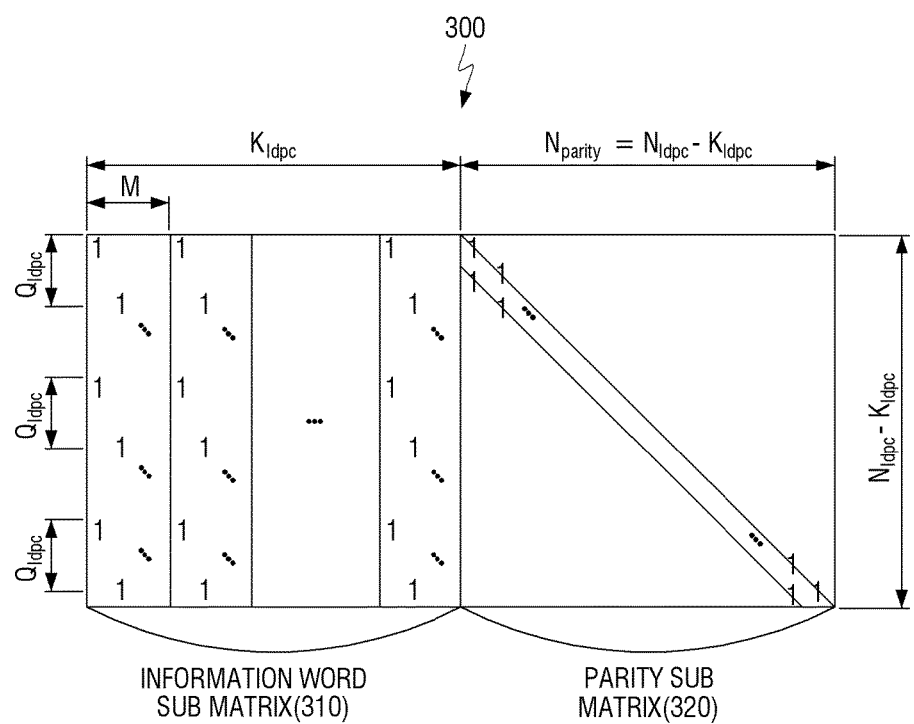
FIG. 3 is a view to illustrate a configuration of a parity check matrix used in Low Density Parity Check (LDPC) encoding, according to an exemplary embodiment.

FIG. 3 is a view to illustrate a configuration of a parity check matrix used in LDPC encoding, according to an exemplary embodiment.

Referring to FIG. 3, the parity check matrix 300 includes an information word sub matrix 310 corresponding to an information word, and a parity sub matrix 320 corresponding to a parity bit. In the information word sub matrix 310 and the parity sub matrix 320, elements other than elements with 1 have 0.

The information word sub matrix 310 includes $K_{ldpc}$ number of columns and the parity sub matrix 320 includes $N_{parity} = N_{ldpc} - K_{ldpc}$ number of columns. The number of rows of the parity check matrix 300 is identical to the number of columns of the parity sub matrix 320, $N_{parity} = N_{ldpc} - K_{ldpc}$.

In addition, in the parity check matrix 320, $N_{ldpc}$ is a length of an LDPC codeword, $K_{ldpc}$ is a length of an information word, and $N_{parity} = N_{ldpc} - K_{ldpc}$ is a length of LDPC parity bits.

The information word sub matrix 310 includes $K_{ldpc}$ number of columns (that is, $0^{th}$ column to $(K_{ldpc}-1)^{th}$ column), and follows the following rules:

First, M number of columns from among $K_{ldpc}$ number of columns of the information word sub matrix 310 belong to a same group, and $K_{ldpc}$ number of columns are divided into $K_{ldpc}/M$ number of column groups. Columns belonging to the same column group are cyclic-shifted from one another by $Q_{ldpc}$.

Herein, M is an interval at which a pattern of columns is repeated in the information word sub matrix 310 (e.g., M=360), and $Q_{ldpc}$ is a size by which each column is cyclic-shifted in the information word sub matrix 310. M and $Q_{ldpc}$ are integers and are determined to satisfy $Q_{ldpc} = (N_{ldpc} - K_{ldpc})/M$. $K_{ldpc}/M$ is also an integer. M and $Q_{ldpc}$ may vary according to a length of the LDPC codeword and a code rate.

Second, when the degree of the $0^{th}$ column of the $i^{th}$ column group (i=0, 1, . . . , $K_{ldpc}/M-1$) is $D_i$ (herein, the degree is the number of 1 existing in a column and all columns belonging to a same column group have a same degree), and a position of each row where 1 exists is $R_{i,0}^{(0)}$, $R_{i,0}^{(1)}, \ldots, R_{i,0}^{(D_i-1)}$, an index $R_{i,j}^{(k)}$ of a row where $k^{th}$ weight-1 is located in the $j^{th}$ column in the $i^{th}$ column group (that is, an index of a row where $k^{th}$ 1 is located in the $j^{th}$ column in the $i^{th}$ column group) is determined by following Equation 1:

$$R_{i,j}^{(k)} = R_{i,(j-1)}^{(k)} + Q_{ldpc} \bmod(N_{ldpc} - K_{ldpc}) \quad (1),$$

where $k=0, 1, 2, \ldots D_i-1$, $i=0, 1, \ldots, K_{ldpc}/M-1$, and $j=1, 2, \ldots, M-1$.

Equation 1 can be expressed as following Equation 2:

$$R_{i,j}^{(k)} = \{R_{i,0}^{(k)} + (j \bmod M) \times Q_{ldpc}\} \bmod(N_{ldpc} - K_{ldpc}) \quad (2),$$

where $k=0, 1, 2, \ldots D_i-1$, $i=0, 1, \ldots, K_{ldpc}/M-1$, and $j=1, 2, \ldots, M-1$.

In the above equations, $R_{i,j}^{(k)}$ is an index of a row where $k^{th}$ weight-1 is located in the $j^{th}$ column in the $i^{th}$ column group, $N_{ldpc}$ is a length of an LDPC codeword, $K_{ldpc}$ is a length of an information word, $D_i$ is a degree of each column belonging to the $i^{th}$ column group, M is the number of columns belonging to a single column group, and $Q_{ldpc}$ is a size by which each column is cyclic-shifted.

Specifically, referring to Equation 2, when only $R_{i,0}^{(k)}$ is known, the index $R_{i,j}^{(k)}$ of the row where the $k^{th}$ weight-1 is located in the $i^{th}$ column group can be known. Therefore, when the index value of the row where the kth weight-1 is located in the $0^{th}$ column of each column group is stored, a position of column and row where 1 is located in the information word sub matrix 310 having the configuration of FIG. 3 can be known.

According to the above-described rules, all of the columns belonging to the $i^{th}$ column group have the same degree $D_i$. Accordingly, the LDPC code which stores information on the parity check matrix 300 according to the above-described rules may be briefly expressed as follows.

For example, when $N_{ldpc}$ is 30, $K_{ldpc}$ is 15, and $Q_{ldpc}$ is 3, position information about the row where weight-1 is located in the $0^{th}$ column of the three column groups may be expressed by a sequence as shown below and may be referred to as "weight-1 position sequence".

$$R_{1,0}^{(1)}=1, R_{1,0}^{(2)}=2, R_{1,0}^{(3)}=8, R_{1,0}^{(4)}=10$$

$$R_{2,0}^{(1)}=0, R_{2,0}^{(2)}=9, R_{2,0}^{(3)}=13$$

$$R_{3,0}^{(1)}=0, R_{3,0}^{(2)}=14.$$

In the above sequence, $R_{i,j}^{(k)}$ is an index of a row where $k^{th}$ weight-1 is located in the $j^{th}$ column in the $i^{th}$ column group.

The weight-1 position sequence like the above which expresses an index of a row where 1 is located in the $0^{th}$ column of each column group may be briefly expressed as in Table 1 presented below:

TABLE 1

| 1 2 8 10 |
| 0 9 13 |
| 0 14 |

Table 1 shows positions of elements having weight-1, that is, a 1 value, in the parity check matrix 300, and the $i^{th}$ weight-1 position sequence is expressed by indexes of rows where weight-1 is located in the $0^{th}$ column belonging to the $i^{th}$ column group.

Based on the above descriptions, the information word sub matrix 310 according to an exemplary embodiment may be defined as in Table 2 presented below.

Specifically, the information word sub matrix 310 includes a plurality of column groups each including 360 columns, and a position of a value 1 in the $0^{th}$ column of each of the plurality of column groups may be defined as in Table 2 presented below. In this case, the length $N_{ldpc}$ of the LDPC codeword is 16200, the length $K_{ldpc}$ of the information word is 7560, the code rate is 7/15, and M is 360.

TABLE 2

| i | indexes of rows where 1 is located in a 0th column of the ith column group: |
|---|---|
| 0 | 432 655 893 942 1285 1427 1738 2199 2441 2565 2932 3201 4144 4419 4678 4963 5423 5922 6433 6564 6656 7478 7514 7892 |
| 1 | 220 453 690 826 1116 1425 1488 1901 3119 3182 3568 3800 3953 4071 4782 5038 5555 6836 6871 7131 7609 7850 8317 8443 |
| 2 | 300 454 497 930 1757 2145 2314 2372 2467 2819 3191 3256 3699 3984 4538 4965 5461 5742 5912 6135 6649 7636 8078 8455 |
| 3 | 24 65 565 609 990 1319 1394 1465 1918 1976 2463 2987 3330 3677 4195 4240 4947 5372 6453 6950 7066 8412 8500 8599 |
| 4 | 1373 4668 5324 7777 |
| 5 | 189 3930 5766 6877 |
| 6 | 3 2961 4207 5747 |
| 7 | 1108 4768 6743 7106 |
| 8 | 1282 2274 2750 6204 |
| 9 | 2279 2587 2737 6344 |
| 10 | 2889 3164 7275 8040 |
| 11 | 133 2734 5081 8386 |
| 12 | 437 3203 7121 |
| 13 | 4280 7128 8490 |
| 14 | 619 4563 6206 |
| 15 | 2799 6814 6991 |
| 16 | 244 4212 5925 |
| 17 | 1719 7657 8554 |
| 18 | 53 1895 6685 |
| 19 | 584 5420 6856 |
| 20 | 2958 5834 8103 |

Table 2 shows indexes of rows where 1 is located in the $0^{th}$ column of the $i^{th}$ column group of the information word sub matrix 310 of the parity check matrix 300 (that is, the first column of the $i^{th}$ column group in the information word sub matrix 310).

That is, the information word sub matrix 310 has 21 column groups each including 360 columns and the position of the value 1 in the $0^{th}$ column of each column group may be defined by Table 2 described above. For example, in the case of the $0^{th}$ column of the $0^{th}$ column group, 1 exists in the $432^{nd}$ row, $655^{th}$ row, $893^{rd}$ row, . . . .

In addition, by shifting the row where 1 is located in the $0^{th}$ column of each column group by $Q_{ldpc}$, a row where 1 is located in another column of the corresponding column group may be defined.

Specifically, in the case of Table 2, since $Q_{ldpc}=(N_{ldpc}-K_{ldpc})/M=(16200-7560)/360=24$ and the indexes of the rows where 1 is located in the $0^{th}$ column of the $0^{th}$ column group are 432, 655, 893, . . . , indexes of rows where 1 is located in the $1^{st}$ column of the $0^{th}$ column group are 456(=432+24), 679(=655+24), 917(=893+24), . . . , and indexes of rows where 1 is located in the $2^{nd}$ column of the $0^{th}$ column group are 480(=456+24), 703(=679+24), 941 (=917+24) . . . .

The parity sub matrix 320 includes $N_{ldpc}-K_{ldpc}$ number of columns (that is, $K_{ldpc}^{th}$ column to $(N_{ldpc}-1)^{th}$ column), and has a dual diagonal configuration. Accordingly, the degree of columns except for the last column (that is, $(N_{ldpc}-1)^{th}$ column) from among the columns included in the parity sub matrix 320 is two (2), and the degree of the last column is one (1).

As a result, when the length $N_{ldpc}$ of the LDPC codeword is 16200, the length $K_{ldpc}$ of the information word is 7560, the code rate is 7/15, and M is 360, the indexes of the rows where 1 is located in the $0^{th}$ column of the $i^{th}$ column group of the information word sub matrix 310 (that is, the first column of the $i^{th}$ column group the information word sub matrix 310) are defined as in Table 2, and the parity check matrix 320 may have a dual diagonal configuration. Information on the parity check matrix 300 described above may be pre-stored in the transmitter 200.

Referring back to FIG. 2, the demux (or demultiplexer) 220 demultiplexes a plurality of bits constituting an LDPC codeword.

The demux 220 performs bit-to-cell conversion with respect to the plurality of bits constituting the LDPC codeword, thereby demultiplexing the LDPC codeword into cells (or a parallel cell word) so that a cell has a predetermined number of bits.

The demux 220 may demultiplex the LDPC codeword by outputting the plurality of bits constituting the LDPC codeword to a plurality of sub streams. That is, the demux 220 may convert the bits constituting the LDPC codeword into cells by outputting the bits of the LDPC codeword to the plurality of sub streams, and may output the cells. Here, the demux 220 may demultiplex the LDPC codeword by dividing the plurality of bits into a plurality of bit groups and outputting the plurality of bit groups to the plurality of sub streams, respectively. Further, the demultiplexing may be performed by outputting bits included in each of the bit groups to each of the sub streams in sequence.

Bits having a same index in the plurality of sub streams may constitute a same cell. For example, bits firstly output from each sub stream first constitute a same cell and bits output secondarily from the each sub stream constitute another same cell.

The number of bits constituting a modulation symbol generated by the modulator 230 may be referred to as a modulation degree (or modulation order). Since a cell includes a same number of bits as bits included in a modulation symbol, the number of sub streams may be equal to the modulation degree.

For example, it is assumed that the modulator 230 performs 16-QAM modulation. Since the modulation symbol is formed of four (4) bits, the demux 220 outputs bits constituting the LDPC codeword to four (4) sub streams and bits having a same index in the four sub streams constitute a same cell.

Hereinafter, a method for the demux 220 to determine sub streams from which the bits constituting the LDPC codeword are output will be explained.

The demux 220 may determine sub streams in which the bits constituting the LDPC codeword are demultiplexed based on Table 3 presented below:

TABLE 3

| Modulation format | | QPSK | | | | | |
|---|---|---|---|---|---|---|---|
| input bit-number, di mod $\eta_{MOD}$ | 0 | 1 | | | | | |
| Output bit-number, e | 0 | 1 | | | | | |
| Modulation format | | | 16-QAM | | | | |
| input bit-number, di mod $\eta_{MOD}$ | 0 | 1 | 2 | 3 | | | |
| Output bit-number, e | 0 | 2 | 1 | 3 | | | |
| Modulation format | | | 64-QAM | | | | |
| input bit-number, di mod $\eta_{MOD}$ | 0 | 1 | 2 | 3 | 4 | 5 | |
| Output bit-number, e | 2 | 0 | 1 | 3 | 4 | 5 | |
| Modulation format | | | 256-QAM | | | | |
| input bit-number, di mod $\eta_{MOD}$ | 0 | 1 | 2 | 3 | 4 | 5 | 6 | 7 |
| Output bit-number, e | 4 | 2 | 0 | 1 | 3 | 5 | 6 | 7 |

In Table 3 above, di is an index of bits input to the demux 220, $\eta_{MOD}$ is a modulation degree, and e is an index of a sub stream.

For example, when the modulator 230 performs 16-QAM modulation, the demux 220 may output input bits $q_0$, $q_1$, $q_2$, ..., to four (4) sub streams. In this case, each sub stream may have 0, 1, 2, 3 as an index.

With reference to Table 3, the demux 220 may output the $0^{th}$, $4^{th}$, $8^{th}$, ... bits indexes of which satisfy di mod $\eta_{MOD}$=0 from among the input bits (that is, $q_0$, $q_4$, $q_8$, ...) to the $0^{th}$ sub stream, may output the $1^{st}$, $5^{th}$, $9^{th}$, ... bits indexes of which satisfy di mod $\eta_{MOD}$=1 (that is, $q_1$, $q_5$, $q_9$, ...) to the $2^{nd}$ sub stream, may output the $2^{nd}$, $6^{th}$, $10^{th}$, ... bits indexes of which satisfy di mod $\eta_{MOD}$=2 (that is, $q_2$, $q_6$, $q_{10}$, ...) to the $1^{st}$ sub stream, and may output the $3^{rd}$, $7^{th}$, $11^{th}$, ... bits indexes of which satisfy di mod $\eta_{MOD}$=3 (that is, $q_3$, $q_7$, $q_{11}$, ...) to the $3^{rd}$ sub stream.

Bits having an index of 0 in each sub stream, that is, bits output from each sub stream in the $0^{th}$ place, $q_0$, $q_2$, $q_1$, $q_3$, may constitute a single cell, bits having an index of 1 in each sub stream, that is, bits output from each sub stream in the $1^{st}$ place, $q_4$, $q_6$, $q_5$, $q_7$, may constitute a single cell, and bits having an index of 2 in each sub stream, that is, bits output from each sub stream in the $2^{nd}$ place, $q_8$, $q_{10}$, $q_9$, $q_{11}$, may constitute a single cell, The modulator 230 modulates the demultiplexed bits. Specifically, the modulator 230 may modulate cells output from the demux 220 by mapping the cells onto constellation points by using various modulation methods such as BPSK, QPSK, 16-QAM, 64-QAM, 256-QAM, or other modulation methods. When the modulation method is BPSK, QPSK, 16-QAM, 64-QAM, and 256-QAM, the number of bits constituting the modulated cell (that is, the modulation symbol), that is, the modulation degree $\eta_{MOD}$ may be 1, 2, 4, 6, 8, respectively.

As described above, the modulator 230 maps the cells output from the demux 220 onto constellation points. Therefore, the modulator 230 may be referred to as a constellation mapper.

The transmitter 200 may transmit modulation symbols to a receiver (not shown). For example, the transmitter 200 maps the modulation symbols onto a frame and may transmit the frame to the receiver via an allocated channel. In this case, modulation symbols regarding an L1 signaling may be mapped onto the preamble symbol of the frame.

According to an exemplary embodiment, a specific bit may be mapped onto a specific location of a modulation symbol by demultiplexing for the following reasons.

Specifically, bits constituting a modulation symbol may be divided into relatively high detection performance bits and relatively low detection performance bits. For example, the relatively high detection performance bits may be bits for determining a sign of a real number component and an imaginary number component of a constellation point. In addition, bits constituting an LDPC codeword may be divided into relatively high error correction performance bits and relatively low error correction performance bits according to a position of 1 and the number of 1 in a parity check matrix.

Accordingly, by mapping a specific bit onto a specific location of a modulation symbol by demultiplexing, relatively high error correction performance bits may be evenly mapped onto the modulation symbol according to detection performance of bits constituting the modulation symbol, and thus harmony between the detection performance and the error correction performance can be achieved.

Figure 4:
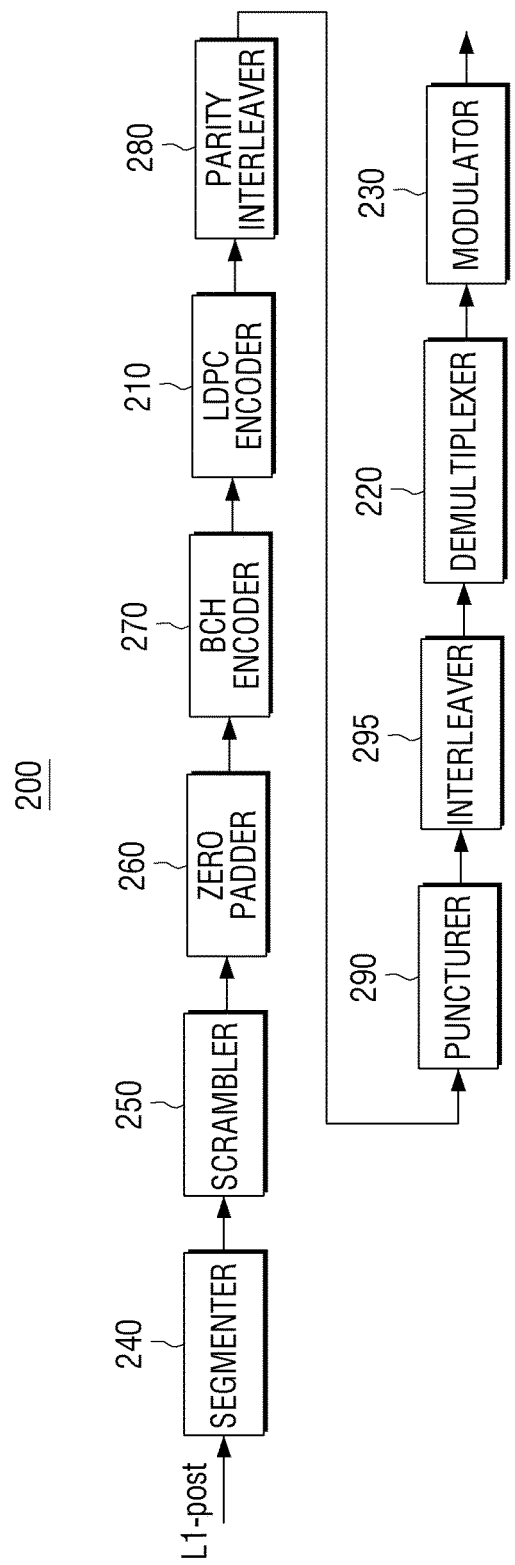
FIG. 4 is a block diagram to illustrate a detailed configuration of a transmitter, according to an exemplary embodiment.

FIG. 4 is a block diagram to illustrate a detailed configuration of a transmitter according to an exemplary embodiment. Referring to FIG. 4, the transmitter 200 may further include a segmenter 240, a scrambler 250, a zero padder 260, a Bose, Chaudhuri, Hocquenghem (BCH) encoder 270, a parity interleaver 280, a puncturer 290, and an interleaver 295, in addition to an LDPC encoder 210, a demux 220, and a modulator 230. Herein, the LDPC encoder 210, the demux 220, and the modulator 230 are the same as those of FIG. 2, and thus a redundant explanation is omitted.

The segmenter 240 segments an L1 post signaling. Specifically, since a length of the L1 post signaling is variable, the segmenter 240 may segment the L1 post signaling to have bits less than a predetermined number, and may output a plurality of segmented L1 post signalings to the scrambler 250.

A segmented L1 post signaling may be referred to as an L1 post signaling block (or an L1 post signaling bit string) formed of bits less than a predetermined number. That is, the segmenter 240 may generate a plurality of L1 post signaling blocks by segmenting the L1 post signaling, and may output the plurality of L1 post signaling blocks to the scrambler 250.

In the above-described exemplary embodiment, the segmenter 240 segments the L1 post signaling. However, this is merely an example. That is, if the L1 post signaling is formed of bits lower than the predetermined number, the segmenter 240 may not perform the segmentation operation.

The scrambler 250 scrambles the segmented L1 post signalings. That is, the scrambler 250 may randomize bits constituting each of the segmented L1 post signalings, and output the randomized L1 post signalings to the zero padder 260.

Since the scrambler 250 scrambles the plurality of segmented L1 post signalings, the scrambler 250 may be implemented in a plural number, and thus, the plurality of scramblers may scramble the segmented L1 post signalings.

The zero padder 260 pads zero bits (or a zero padding bit) to the segmented L1 post signalings. Here, a zero bit refers to a bit having a value 0.

Specifically, the BCH encoder 270 may generate a BCH codeword by BCH encoding and output the BCH codeword to the LDPC encoder 210, and the LDPC encoder 210 may LDPC-encode the BCH codeword as an information word of the LDPC code. Since the LDPC encoding performed in the LDPC encoder 210 requires an information word of a predetermined length according to a code rate, the BCH encoder 270 should generate a BCH codeword having the predetermined length.

In order to generate the BCH codeword having the predetermined length, the BCH encoder 270 should perform BCH encoding with respect to a predetermined number of bits. Accordingly, the zero padder 260 may pad the zero bits to each of the segmented L1 post signalings so that the segmented L1 post signaling has a length of the information word required by BCH encoding, and may output the L1 post signalings in which the zero bits are padded to the BCH encoder 270.

For example, if the length of the information word required by BCH encoding is $K_{bch}$ and a length of a segmented L1 post signaling is $K_{sig}$, the zero padder 260 may pad as many the zero bits as $K_{bch}-K_{sig}$ bits to the segmented L1 post signaling.

However, if the segmented L1 post signaling satisfies the length of the information word required by BCH encoding, the zero padder 260 may not perform the zero bit padding operation.

Since the zero padder 260 pads the zero bits to the plurality of scrambled L1 post signalings, the zero padder 260 may be implemented in a plural number, and thus, the plurality of zero padders may pad the zero bits to each of the scrambled L1 post signalings.

The BCH encoder 270 may perform BCH encoding with respect to the L1 post signalings in which the zero bits are padded, and output a plurality of BCH codewords generated by the BCH encoding (that is, BCH-encoded bits) to the LDPC encoder 210.

Specifically, since a BCH code used in BCH encoding is a systematic code, an information word may be included in a BCH codeword as it is. That is, the BCH encoder 270 may generate the BCH codeword by BCH encoding input bits as the information word, and the BCH codeword may be in a form of BCH parity bits added to the input bits of the information word. The BCH parity bits may be formed of 168 bits.

Since the BCH encoder 270 performs BCH encoding with respect to L1 post signalings in which a plurality of zero bits are padded, the BCH encoder 270 may be implemented in a plural number, and thus, the plurality of BCH encoders may perform BCH encoding with respect to each of the L1 post signalings in which the zero bits are padded.

The LDPC encoder 210 may perform LDPC encoding with respect to BCH codewords output from the BCH encoder 270, and may output LDPC codewords generated by LDPC encoding to the parity interleaver 280.

Specifically, the LDPC encoder 210 may receive bits ($i_0$, $i_1$, ... $i_{N_{bch}-1}$) output from the BCH encoder 270, and generate an LDPC codeword $C=(c_0, c_1, \ldots, c_{N_{ldpc}-1})=(i_0, i_1, \ldots i_{K_{ldpc}-1}), p_0, p_1, \ldots, p_{N_{ldpc}-K_{ldpc}-1})$ by performing LDPC encoding.

In this case, a length $N_{bch}$ of the BCH codeword may be equal to a length $K_{ldpc}$ of the information word of the LDPC code. That is, $N_{bch}=K_{ldpc}$. That is, the BCH codeword ($i_0$, $i_1$, ..., $i_{N_{bch}-1}$) including ($K_{bch}-K_{sig}$) zero bits and ($K_{ldpc}-K_{bch}$) BCH parity bits may constitute the information word of the LDPC codeword.

The LDPC encoder 210 may generate the LDPC codeword having a predetermined length by performing LDPC encoding based on various code rates.

For example, when the length $K_{bch}$ of an information word of the BCH encoder 270 is 7392, and the length $K_{ldpc}$ of an information word of the LDPC encoder 210 is 7560, the LDPC encoder 210 may generate an LDPC codeword by performing LDPC encoding at a code rate of 7/15. In this case, the length $N_{ldpc}$ of the LDPC codeword may be 16200.

Since the LDPC encoder 210 performs LDPC encoding with respect to a plurality of BCH codewords, the LDPC encoder 210 may be implemented in a plural number, and thus, the plurality of LDPC encoders may perform LDPC encoding with respect to each of the BCH codewords.

The parity interleaver 280 interleaves an output of the LDPC encoder 210. That is, the parity interleaver 280 may interleave LDPC parity bits included in each of a plurality of LDPC codewords output from the LDPC encoder 210, and output each of the parity-interleaved LDPC codewords to the puncturer 290.

In this case, the parity interleaver 280 may perform parity interleaving based on various interleaving rules.

For example, the parity interleaver 280 may interleave only the LDPC parity bits of the LDPC codewords $C=(c_0, c_1, \ldots, c_{N_{ldpc}-1})$ output from the LDPC encoder 210 based on Equation 3 presented below, and output parity-interleaved LDPC codewords $U=(u_0, u_1, \ldots, u_{N_{ldpc}-1})$ to the puncturer 290.

$u_i = c_i$ for $0 \leq i < K_{ldpc}$ (information bits are not interleaved)

$u_{K_{ldpc}+360xt+s} = c_{K_{ldpc}+Q_{ldpc}xs+t}$ for $0 \leq s < 360, 0 \leq t < Q_{ldpc}$     (3), where $Q_{ldpc}$ may be 24. In addition, $K_{ldpc}$ may be a length of an information word of an LDPC codeword.

Since the parity interleaver 280 performs parity interleaving with respect to the plurality of LDPC codewords, the parity interleaver 280 may be implemented in a plural number, and thus, the plurality of parity interleaves may perform interleaving with respect to the LDPC parity bits included in each of the LDPC codewords.

The puncturer 290 may puncture some of bits output from the parity interleaver 280. The puncturing recited herein refers to an operation of removing some of the parity bits and refraining from transmitting. Therefore, the punctured LDPC parity bits may not be transmitted to the receiver.

Specifically, the puncturer 290 may puncture some LDPC parity bits in each of the plurality of LDPC codewords. The number of LDPC parity bits to be punctured may be determined according to a code rate and the number of LDPC parity bits.

In addition, the puncturer 290 may remove zero bits padded by the zero padder 260. Specifically, the puncturer 290 may remove $K_{bch} - K_{sig}$ number of zero bits padded by the zero padder 260 from each of the plurality of LDPC codewords. Accordingly, $K_{bch} - K_{sig}$ number of zero bits removed from each LDPC codeword may not be transmitted to the receiver.

The operation of removing the padded zero bits after encoding them as described above may be referred to as shortening. The shortened bits may not be transmitted to the receiver.

As a result, the puncturer 290 punctures some LDPC parity bits in the LDPC codeword and removes the zero bits padded by the zero padder 210, and then outputs resulting bits to the interleaver 295.

Since the puncturer 290 performs puncturing and shortening with respect to the plurality of LDPC codewords, the puncturer 290 may be implemented in a plural number and the plurality of puncturers may perform puncturing and shortening with respect to each of the LDPC codewords.

The interleaver 295 interleaves bits output from the puncturer 290 and outputs the interleaved bits to the demux 220. The interleaver 295 may interleave bits constituting each LDPC codeword output from the puncturer 290 by using $N_c$ number of columns each including $N_r$ number or rows.

Specifically, the interleaver 295 may perform interleaving by writing the bits output from the puncturer 290 on the first column to the $N_c^{th}$ column in a column direction, and reading the bits from the first row to the $N_r^{th}$ row in a row direction. Accordingly, the bits written on a same row of each column are output in sequence such that the bits are rearranged in a different order from that before being interleaved.

The interleaver 295 may perform interleaving selectively according to a modulation method. For example, the interleaver 295 may perform interleaving only when the modulation method is 16-QAM, 64-QAM, or 256-QAM.

In addition, the number of columns $N_c$ and the number of rows $N_r$ constituting the interleaver 295 may be changed according to a modulation method and a code rate of an LDPC code for the LDPC coding.

For example, it is assumed that an LDPC codeword output from the puncturer 290 is formed of $N_{L1post}$ number of bits. In this case, when the number of LDPC parity bits punctured by the puncturer 290 is $N_{punc}$, $N_{L1post}$ may satisfy $N_{L1post} = K_{sig} + 168 + (N_{ldpc} - K_{ldpc}) - N_{punc}$.

In this case, the number of columns $N_c$ and the number of rows $N_r$ constituting the interleaver 295 may be defined as in Table 4 presented below:

TABLE 4

| Modulation and Code rate | | Rows $N_r$ | Columns $N_C$ |
|---|---|---|---|
| 16-QAM | 7/15 | $N_{L1\_post}/4$ | 4 |
| 64-QAM | 7/15 | $N_{L1\_post}/6$ | 6 |
| 256-QAM | 7/15 | $N_{L1\_post}/8$ | 8 |

Since the interleaver 295 performs interleaving with respect to the plurality of LDPC codewords, the interleaver 295 may be implemented in a plural number, and thus, the plurality of interleavers may perform interleaving with respect to each of the LDPC codewords.

The demux 220 may demultiplex bits output from the interleaver 295 and may output cells generated by demultiplexing to the modulator 230.

Specifically, the demux 220 may demultiplex bits constituting each LDPC codeword output from the interleaver 295 into cells each of which is formed of a predetermined number of bits.

For example, it is assumed that an LDPC codeword output from the interleaver 295 is formed of $N_{L1post}$ number of bits. $N_{L1post}$ may satisfy $N_{L1post} = K_{sig} + 168 + (N_{ldpc} - K_{ldpc}) - N_{punc}$ as described above.

In this case, the number of cells output from the demux 220 may be shown in Table 5 presented below:

TABLE 5

| Modulation mode | $\eta_{MOD}$ | Number of output data cells per codeword |
|---|---|---|
| BPSK | 1 | $N_{L1\_post}$ |
| QPSK | 2 | $N_{L1\_post}/2$ |
| 16-QAM | 4 | $N_{L1\_post}/4$ |
| 64-QAM | 6 | $N_{L1\_post}/6$ |
| 256-QAM | 8 | $N_{L1\_post}/8$ |

In Table 5 above, $\eta_{MOD}$ is a modulation degree.

For example, if the modulation method is 16-QAM, the modulation degree $\eta_{MOD}$, that is, the number of bits constituting a modulation symbol is four (4). In this case, since each cell output from the demux 220 is formed of four (4) bits, the number of cells output from the demux 220 may be $N_{L1post}/4$.

Hereinafter, a method for the demux 220 to perform demultiplexing when bits input to the demux 220 (that is, bits constituting the LDPC codeword) are $q_0, q_1, \ldots, q_{N_{L1post}-1}$ will be explained in detail with reference to FIG. 5.

First, parameters related to demultiplexing may be defined as follows:
- di is an index of a bit input to the demux 220.
- $q_{di}$ is a bit input to the demux 220.
- e is an index of a sub stream. That is, e is an index of a sub stream which is a result of demultiplexing bits input to the demux 220 and is an integer satisfying $0 \le e < \eta_{MOD}$.
- do is $$\left\lfloor \frac{di}{\eta_{MOD}} \right\rfloor$$

and is an index of a bit constituting each sub stream (Herein, $\lfloor x \rfloor$ is a greatest integer smaller than x and for example $\lfloor 1.2 \rfloor = 1$).

$y_{e,do}$ is an output of the demux 220.

Figure 5:
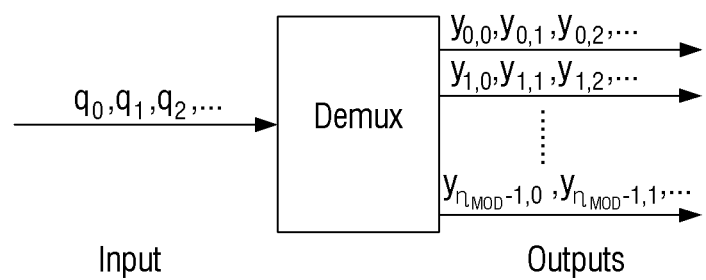
FIG. 5 is a view to illustrate a demultiplexer, according to an exemplary embodiment.

Specifically, as shown in FIG. 5, the demux 230 may determine an index of a sub stream onto which an input bit $q_{di}$ is to be mapped from among $\eta_{MOD}$ number of sub streams with reference to Table 3 described above, and may output the input bit $q_{di}$ to the determined sub stream In this case, bits having a same index in the sub streams may constitute a same cell. In the case of FIG. 5, the cell may be $(y_{0,0}, y_{1,0}, \ldots, y_{\eta_{MOD}-1,0}), (y_{0,0}, y_{1,0}, \ldots, y_{\eta_{MOD}-1,1})$.

For example, if the modulator 230 performs 16-QAM modulation, the demux 220 may output input bits $q_0, q_1, q_2, \ldots$, to four (4) sub streams in sequence. In this case, each sub stream may have 0, 1, 2, 3 as an index.

Specifically, with reference to Table 3, the demux 220 may output the $0^{th}, 4^{th}, 8^{th}, \ldots$ bits indexes of which satisfy di mod $\eta_{MOD}=0$ from among the input bits (that is, $q_0, q_4, q_8, \ldots$) to the $0^{th}$ sub stream, may output the $1^{st}, 5^{th}, 9^{th}, \ldots$ bits indexes of which satisfy di mod $\eta_{MOD}=1$ (that is, $q_1, q_5, q_9, \ldots$) to the $2^{nd}$ sub stream, may output the $2^{nd}, 6^{th}, 10^{th}, \ldots$ bits indexes of which satisfy di mod $\eta_{MOD}=2$ (that is, $q_1, q_6, q_{10}, \ldots$) to the $1^{st}$ sub stream, and may output the $3^{rd}, 7^{th}, 11^{th}, \ldots$ bits indexes of which satisfy di mod $\eta_{MOD}=3$ (that is, $q_3, q_7, q_{11}, \ldots$) to the $3^{rd}$ sub stream.

Accordingly, $q_0, q_4, q_8,$ are output to the $0^{th}$ sub stream in sequence, $q_2, q_6, q_{10}, \ldots$ are output to the $1^{st}$ sub stream in sequence, $q_1, q_5, q_9, \ldots$ are output to the $2^{nd}$ sub stream in sequence, and $q_3, q_7, q_{11}, \ldots$ are output to the $3^{rd}$ sub stream in sequence.

Accordingly, in the four (4) sub streams, the $0^{th}$ bits $(y_{0,0}, y_{1,0}, y_{2,0}, y_{3,0}) = (q_0, q_2, q_1, q_3)$ constitute a single cell, the $1^{st}$ bits $(y_{0,1}, y_{1,1}, y_{2,1}, y_{3,1}) = (q_4, q_6, q_5, q_7)$ constitute a single cell, and the $2^{nd}$ bits $(y_{0,2}, y_{1,2}, y_{2,2}, y_{3,2}) = (q_8, q_6, q_9, q_{11})$ constitute a single cell.

Since the demux 220 performs demultiplexing with respect to a plurality of LDPC codewords, the demux 220 may be implemented in a plural number, and thus, the plurality of demuxes may perform demultiplexing with respect to each of the LDPC codewords.

The modulator 230 modulates the demultiplexed bits. Specifically, the modulator 230 may map a cell output from the demux 220, $(y_{0,q}, y_{1,q}, \ldots, y_{\eta_{MOD}-1,q})$, onto a constellation point $z_q$ by using various modulation methods such as BPSK, QPSK, 16-QAM, 64-QAM, 256-QAM, or other modulation methods.

In this case, a real number component $Re(z_q)$ and an imaginary number component $Im(z_q)$ constituting the constellation point $z_q$ may be expressed according to a modulation method as shown in Tables 6 to 14:

TABLE 6

| | | |
|---|---|---|
| $y_{0,q}$ | 1 | 0 |
| $Re(z_q)$ | −1 | 1 |
| $Im(z_q)$ | 0 | 0 |

TABLE 7

| | | |
|---|---|---|
| $y_{0,q}$ | 1 | 0 |
| $Re(z_q)$ | −1 | 1 |

TABLE 8

| | | |
|---|---|---|
| $y_{1,q}$ | 1 | 0 |
| $Im(z_q)$ | −1 | 1 |

TABLE 9

| | | | | |
|---|---|---|---|---|
| $y_{0,q}$ | 1 | 1 | 0 | 0 |
| $y_{2,q}$ | 0 | 1 | 1 | 0 |
| $Re(z_q)$ | −3 | −1 | 1 | 3 |

TABLE 10

| | | | | |
|---|---|---|---|---|
| $y_{1,q}$ | 1 | 1 | 0 | 0 |
| $y_{3,q}$ | 0 | 1 | 1 | 0 |
| $Im(z_q)$ | −3 | −1 | 1 | 3 |

TABLE 11

| | | | | | | | | |
|---|---|---|---|---|---|---|---|---|
| $y_{0,q}$ | 1 | 1 | 1 | 1 | 0 | 0 | 0 | 0 |
| $y_{2,q}$ | 0 | 0 | 1 | 1 | 1 | 1 | 0 | 0 |
| $y_{4,q}$ | 0 | 1 | 1 | 0 | 0 | 1 | 1 | 0 |
| $Re(z_q)$ | −7 | −5 | −3 | −1 | 1 | 3 | 5 | 7 |

TABLE 12

| | | | | | | | | |
|---|---|---|---|---|---|---|---|---|
| $y_{1,q}$ | 1 | 1 | 1 | 1 | 0 | 0 | 0 | 0 |
| $y_{3,q}$ | 0 | 0 | 1 | 1 | 1 | 1 | 0 | 0 |
| $y_{5,q}$ | 0 | 1 | 1 | 0 | 0 | 1 | 1 | 0 |
| $Im(z_q)$ | −7 | −5 | −3 | −1 | 1 | 3 | 5 | 7 |

TABLE 13

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 0 | 0 | 0 | 0 | 0 | 0 | 0 | 0 |
| $y_{2,q}$ | 0 | 0 | 0 | 0 | 1 | 1 | 1 | 1 | 1 | 1 | 1 | 1 | 0 | 0 | 0 | 0 |
| $y_{4,q}$ | 0 | 0 | 1 | 1 | 1 | 1 | 0 | 0 | 0 | 0 | 1 | 1 | 1 | 1 | 0 | 0 |
| $y_{6,q}$ | 0 | 1 | 1 | 0 | 0 | 1 | 1 | 0 | 0 | 1 | 1 | 0 | 0 | 1 | 1 | 0 |
| $Re(z_q)$ | −15 | −13 | −11 | −9 | −7 | −5 | −3 | −1 | 1 | 3 | 5 | 7 | 9 | 11 | 13 | 15 |

TABLE 14

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 0 | 0 | 0 | 0 | 0 | 0 | 0 | 0 |
| $y_{3,q}$ | 0 | 0 | 0 | 0 | 1 | 1 | 1 | 1 | 1 | 1 | 1 | 1 | 0 | 0 | 0 | 0 |
| $y_{5,q}$ | 0 | 0 | 1 | 1 | 1 | 1 | 0 | 0 | 0 | 0 | 1 | 1 | 1 | 1 | 0 | 0 |
| $y_{7,q}$ | 0 | 1 | 1 | 0 | 0 | 1 | 1 | 0 | 0 | 1 | 1 | 0 | 0 | 1 | 1 | 0 |
| $\text{Im}(z_q)$ | −15 | −13 | −11 | −9 | −7 | −5 | −3 | −1 | 1 | 3 | 5 | 7 | 9 | 11 | 13 | 15 |

Specifically, Table 6 shows a real number component and an imaginary number component of a constellation point in BPSK, and Tables 7 and 8 show a real number component and an imaginary number component of a constellation point in QPSK. In addition, Tables 9 and 10 show a real number component and an imaginary number component of a constellation point in 16-QAM, and Tables 11 and 12 show a real number component and an imaginary number component of a constellation point in 64-QAM. In addition, Tables 13 and 14 show a real number component and an imaginary number component of a constellation point in 256-QAM, Examples of a constellation in which cells are mapped may be expressed as shown in FIGS. 6 to 9.

Figure 6:
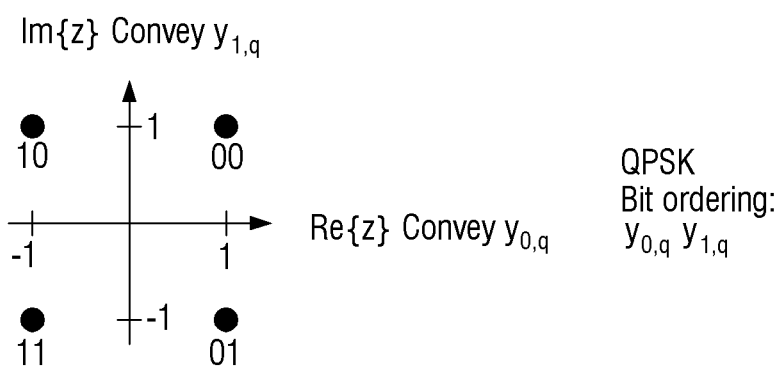
FIGS. 6 to 9 are views to illustrate a modulation method, according to exemplary embodiments.
Figure 7:
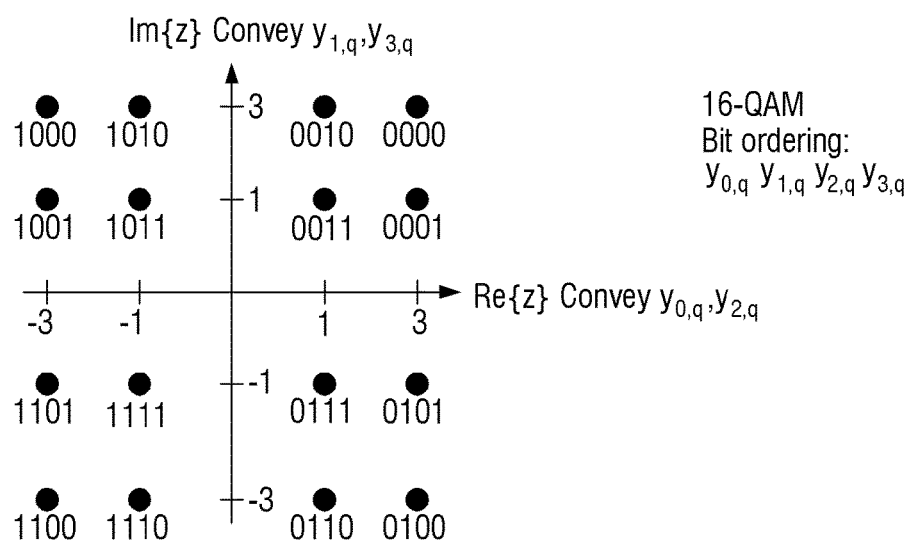
Figure 8:
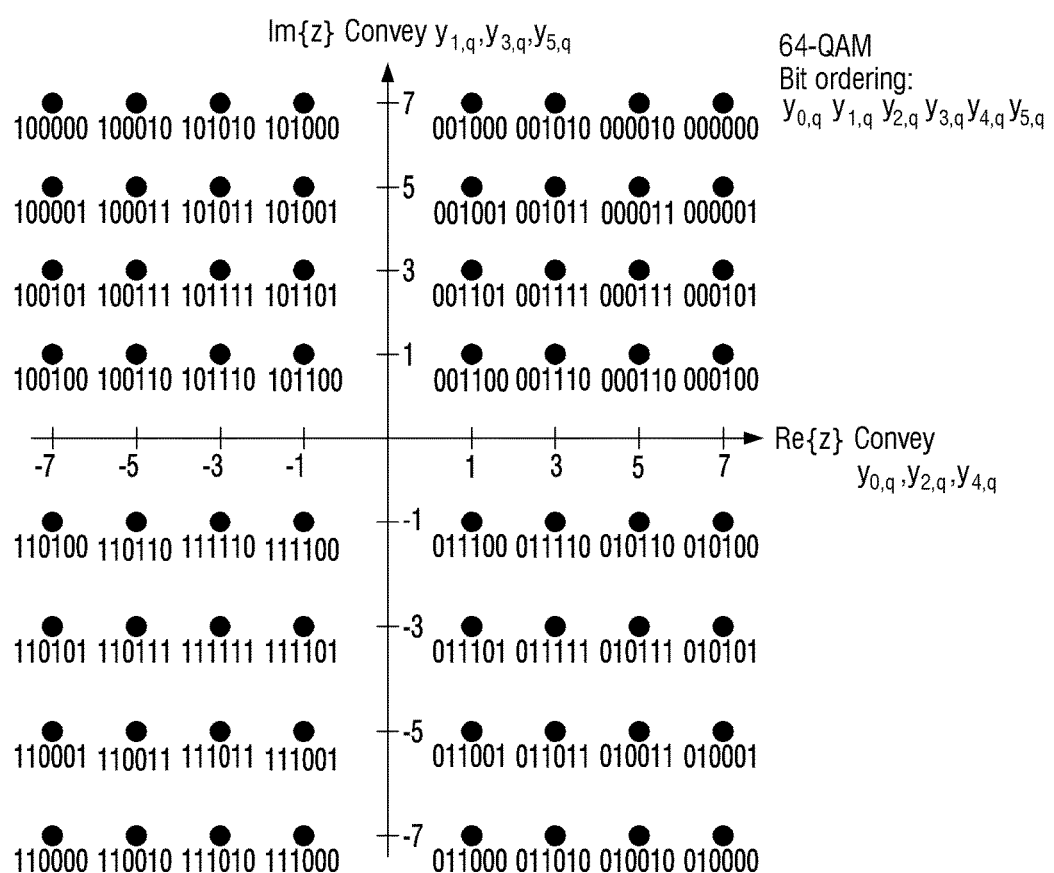
Figure 9:
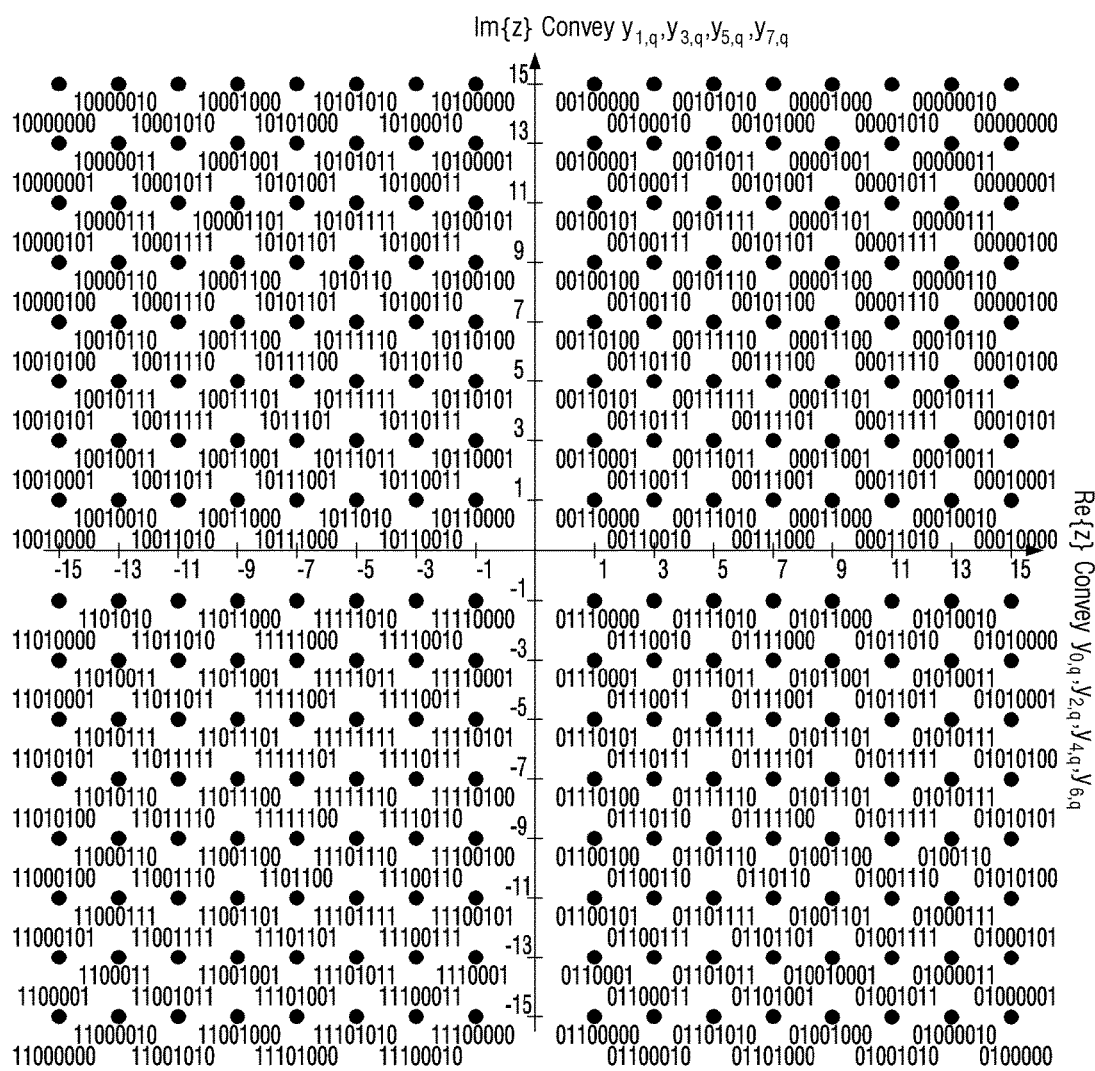

FIG. 6 shows constellation points onto which cells are mapped in QPSK, and FIG. 7 shows constellation points onto which cells are mapped in 16-QAM. In addition, FIG. 8 shows constellation points onto which cell are mapped in 64-QAM, and FIG. 9 shows constellation points onto which cells are mapped in 256-QAM.

As described above, the modulator 230 may determine a real number component and an imaginary number component onto which a cell output from the demux 220 is to be mapped in the constellation, and may generate a modulation symbol by mapping the cell onto a constellation point having a determined real number component and imaginary number component.

The modulator 230 may obtain a complex cell $f_q$ by normalizing a constellation point $z_q$ onto which the cell ($y_{0,q}$, $y_{1,q}$, . . . , $y_{n_{MOD}-1,q}$) is mapped based on Table 15 presented below:

TABLE 15

| Modulation | Normalization |
|---|---|
| BPSK | $f_q = z_q$ |
| QPSK | $f_q = \dfrac{z_q}{\sqrt{2}}$ |
| 16-QAM | $f_q = \dfrac{z_q}{\sqrt{10}}$ |
| 64-QAM | $f_q = \dfrac{z_q}{\sqrt{42}}$ |
| 256-QAM | $f_q = \dfrac{z_q}{\sqrt{170}}$ |

Since the modulator 230 modulates the cells which are generated by demultiplexing the bits constituting each of the plurality of LDPC codewords, the modulator 230 may be implemented in a plural number, and thus, the plurality of modulators may modulate the cells which are generated by demultiplexing the bits constituting each of the plurality of LDPC codewords.

In FIG. 4, the transmitter 200 is illustrated as including all of the segmenter 240, the scrambler 250, the zero padder 260, the BCH encoder 270, the LDPC encoder 210, the parity interleaver 280, the puncturer 290, the interleaver 295, the demux 220, and the modulator 230. However, this is merely an example.

That is, when an L1 post signaling is shorter than a predetermined length, the L1 post signaling is not segmented. Therefore, the segmenter 240 may be omitted from the transmitter 200 in FIG. 4.

Figure 10:
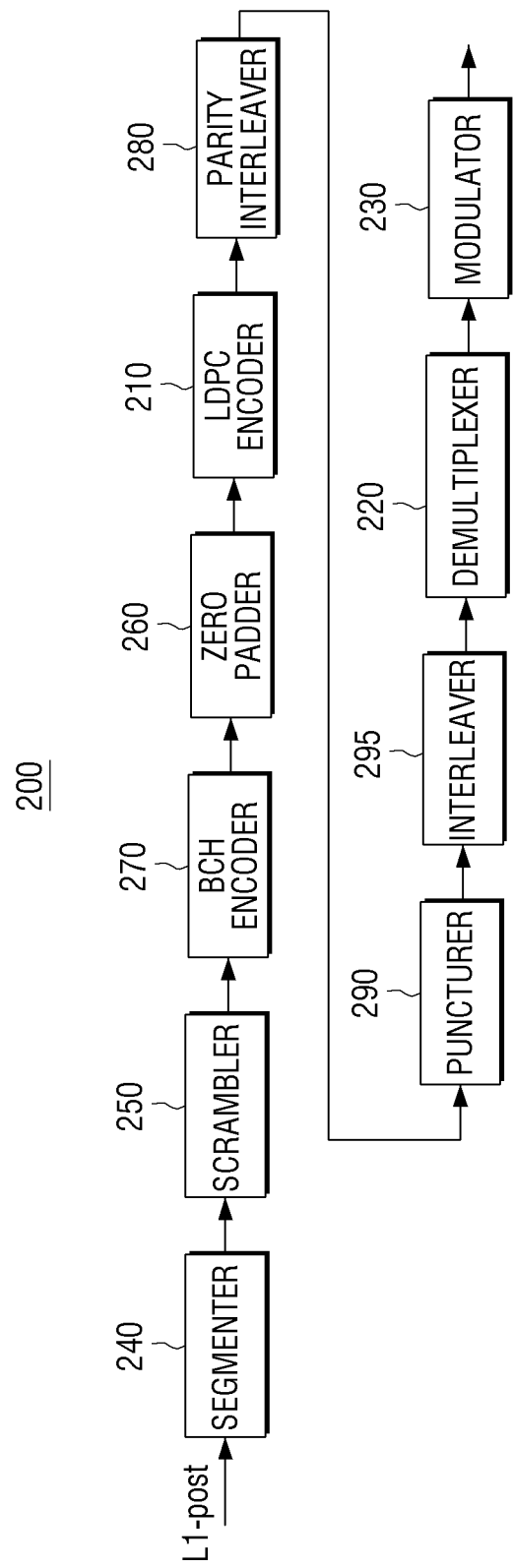
FIG. 10 is a block diagram to illustrate a configuration of a transmitter, according to another exemplary embodiment.

In addition, in FIG. 4, the zero padder 260, the BCH encoder 270, and the LDPC encoder 210 are arranged in this order. However, this is merely an example. As shown in FIG. 10, the zero padder 260 may be disposed between the BCH encoder 270 and the LDPC encoder 210.

FIG. 10 is a block diagram to illustrate a configuration of a transmitter, according to another exemplary embodiment. Referring to FIG. 10, the transmitter 200 includes a segmenter 240, a scrambler 250, a BCH encoder 270, a zero padder 260, an LDPC encoder 210, a parity interleaver 280, a puncturer 290, an interleaver 295, a demux 220, and a modulator 230. The components of the transmitter 200 illustrated in FIG. 10 are different from those of FIG. 4 only in their arrangements and perform the same operations and use the same parameters as in FIG. 4. Accordingly, the above-described difference will be explained.

The BCH encoder 270 performs BCH encoding with respect to scrambled L1 post signalings.

Specifically, the BCH encoder 270 may generate a plurality of BCH codewords by performing BCH encoding with respect to the scrambled L1 post signalings, and may output the plurality of BCH codewords to the zero padder 260. In this case, a BCH codeword may include BCH parity bits of 168 bits.

The zero padder 260 pads zero bits to each of the BCH codewords. Specifically, the zero padder 260 may pad the zero bits to each of the BCH codewords output from the BCH encoder 270, and may output the plurality of BCH codewords in which the zero pads are padded to the LDPC encoder 210.

For example, when a length of a BCH codeword is $N_{bch}$ and a length of an information word required in LDPC encoding is $K_{mpc}$, the zero padder 260 may pad as many zero bits as $K_{ldpc} - N_{bch}$ bits to the BCH codeword.

The LDPC encoder 210 may perform LDPC encoding with respect to the BCH codewords in which the zero bits are padded.

Specifically, the LDPC encoder 210 may generate a plurality of LDPC codewords by performing LDPC encoding with respect to each of the BCH codewords in which the zero bits are padded, and may output the plurality of LDPC codewords to the parity interleaver 280.

In this case, since a BCH codeword to which the zero bits are padded is formed of $K_{ldpc}$ number of bits, the LDPC encoder 210 may generate an LDPC codeword having a length of $N_{ldpc}$ by LDPC encoding the BCH codeword, in which the zero bits are added, as an information word.

The components of the transmitter 200 arranged after the LDPC encoder 210, that is, the parity interleaver 280, the puncturer 290, the interleaver 295, the demux 220, and the modulator 230 perform the same operations as described in FIGS. 2 to 9, and thus, a redundant explanation is omitted.

Figure 11:
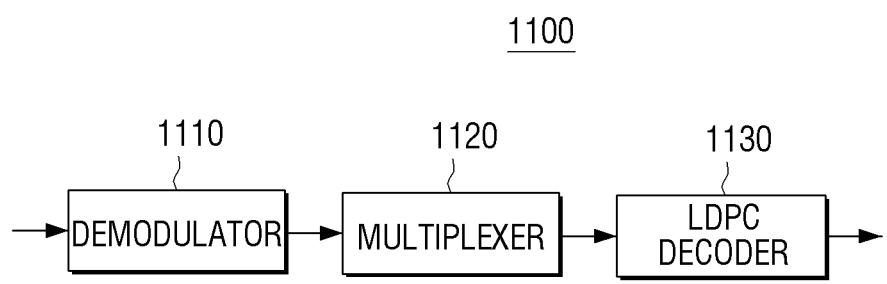
FIG. 11 is a block diagram to illustrate a configuration of a receiver, according to an exemplary embodiment.

FIG. 11 is a block diagram to illustrate a configuration of a receiver, according to an exemplary embodiment. Referring to FIG. 11, the receiver 1100 includes a demodulator 1110, a mux 1120, and an LDPC decoder 1130.

The demodulator 1110 receives and demodulates a signal transmitted from the transmitter 200. Specifically, the demodulator 1110 generates a value corresponding to an LDPC codeword by demodulating the received signal, and outputs the value to the mux 1120.

The value corresponding to the LDPC codeword may be expressed as a channel value. There are various methods for determining the channel value, and for example, a method for determining a Log Likelihood Ratio (LLR) value may be the method for determining the channel value.

The LLR value is a log value for a ratio of a probability that a bit transmitted from the transmitter 200 is 0 and a probability that the bit is 1. In addition, the LLR value may be a bit value which is determined by a hard decision, or may be a representative value which is determined according to a section to which the probability that the bit transmitted from the transmitter 200 is 0 or 1 belongs.

The mux (or multiplexer) 1120 multiplexes an output value of the demodulator 1110 and outputs the value to the LDPC decoder 1130.

Specifically, the mux 1120 is a component corresponding to the demux 220 of the transmitter 200, and performs an operation corresponding to that of the demux 220. That is, the mux 1120 may perform a cell-to-bit conversion on the output value of the demodulator 1110, and may output the LLR value on a bit basis.

In this case, the mux 1120 may multiplex based on Table 3. That is, the mux 1120 may rearrange an order of LLR values corresponding to bits constituting a cell with reference to Table 3, so that an inverse operation of the demultiplexing operation of the demux 220 can be performed.

The LDPC decoder 1130 may perform LDPC decoding by using an output value of the mux 1120.

For example, the LDPC decoder 1130 may perform the LDPC decoding in an interative decoding method based on a sum-product algorithm. The sum-product algorithm is one example of a message passing algorithm, and the message passing algorithm refers to an algorithm which exchanges messages (e.g., LLR value) through an edge on a bipartite graph, calculates an output message from messages input to variable nodes or check nodes, and updates.

The LDPC decoder 1130 may use a parity check matrix when performing the LDPC decoding.

Specifically, when the transmitter 200 performs LDPC encoding with respect to an information word of a length of 7560 at a code rate of 7/15, and generates and transmits an LDPC codeword having a length of 16200, an information word sub matrix may be defined as in Table 2 and a parity sub matrix may have a dual diagonal configuration.

In addition, information on the parity check matrix and information on the code rate, etc. which are used in the LDPC decoding may be pre-stored in the receiver 1100 or may be provided by the transmitter 200.

As described above, the LDPC decoder 1130 may correct an error by performing LDPC decoding, and may generate an L1 post signaling in which an error is corrected.

Figure 12:
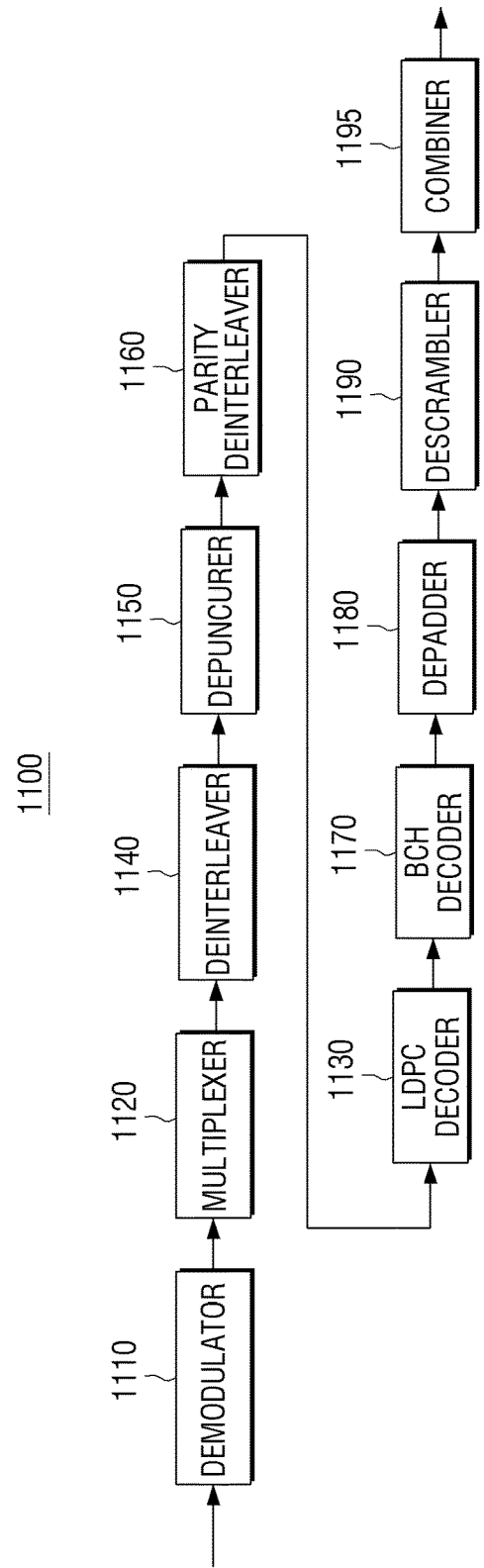
FIG. 12 is a block diagram to illustrate a detailed configuration of a receiver, according to an exemplary embodiment.

FIG. 12 is a block diagram to illustrate a detailed configuration of a receiver, according to an exemplary embodiment. Referring to FIG. 12, the receiver 1100 may further include a deinterleaver 1140, a depuncturer 1150, a parity deinterleaver 1160, a BCH decoder 1170, a depadder 1180, a descrambler 1190, and a combiner 1195, in addition to a demodulator 1110, a mux 1120, and an LDPC decoder 1130. The demodulator 1110, the mux 1120, and the LDPC decoder 1130 are the same as those of FIG. 11, and thus, a detailed explanation thereof is omitted.

The deinterleaver 1140 may deinterleave an output value of the mux 1120, and may output the value to the depuncturer 1150.

Specifically, the deinterleaver 1140 is a component corresponding to the interleaver 295 of the transmitter 200, and may perform an operation corresponding to that of the interleaver 295. That is, the deinterleaver 1140 may perform the interleaving operation of the interleaver 295 inversely, and may deinterleave the output value of the mux 1120.

The depuncturer 1150 adds a specific value to an output value of the deinterleaver 1140, and outputs the value to the parity deinterleaver 1160.

Specifically, the depuncturer 1150 is a component corresponding to the puncturer 290 of the transmitter 200, and performs an operation corresponding to that of the puncturer 290. That is, the depuncturer 1150 may add LLR values corresponding to the punctured LDPC parity bits and LLR values corresponding to the shortened bits to LLR values output from the deinterleaver 1140. Herein, the LLR values corresponding to the punctured bits may be 0, and the LLR values corresponding to the shortened bits may be ∞ or −∞.

To achieve this, the receiver 1100 may pre-store information on the number and locations of LDPC parity bits punctured in the transmitter 200 or may receive the information from the transmitter 200. In addition, the receiver 1100 may pre-store information on the number, locations and bit values of bits shortened in the transmitter 200, or may receive the information from the transmitter 200.

The parity deinterleaver 1160 performs parity deinterleaving with respect to an output value of the depuncturer 1150, and outputs the value to the LDPC decoder 1130.

Specifically, the parity deinterleaver 1160 is a component corresponding to the parity interleaver 280 of the transmitter 200, and performs an operation corresponding to that of the parity interleaver 280. That is, the parity deinterleaver 1160 may perform the parity interleaving operation of the parity interleaver 280 inversely, and may deinterleave LLR values corresponding to the LDPC parity bits from among the LLR values output from the depuncturer 1150.

The LDPC decoder 1130 may perform LDPC decoding based on an output value of the parity deinterleaver 1160. That is, the LDPC decoder 1130 may perform LDPC decoding based on an LLR value output from the parity deinterleaver 1160, and may output bits in which an error is corrected as a result of the decoding to the BCH decoder 1170.

In this case, bits output from the LDPC decoder 1130 may be formed of segmented L1 post signalings, zero bits added to the segmented L1 post signalings, and the BCH parity bits.

The BCH decoder 1170 may perform BCH decoding with respect to an output value of the LDPC decoder 1130, and may output the bits in which the error is corrected as a result of the decoding to the depadder 1180.

That is, since the bits output from the LDPC decoder 1130 are formed of the segmented L1 post signalings, the zero bits added to the segmented L1 post signalings, and the BCH parity bits, the BCH decoder 1170 may correct the error by using the BCH parity bits, and may output the segmented L1 post signalings and the zero bits added to the segmented L1 post signalings to the depadder 1180.

The depadder 1180 may remove the zero bits from an output value of the BCH decoder 1170.

Specifically, the depadder 1180 is a component corresponding to the zero padder 260 of the transmitter 200, and may perform an operation corresponding to that of the zero padder 260. That is, the depadder 1180 may remove the zero bits which have been added by the zero padder 260 from among the bits output from the BCH decoder 1170. Accordingly, the bits output from the depadder 1180 may be the segmented L1 post signalings.

To achieve this, the receiver 1100 may pre-store information on locations where the zero bits are padded in the transmitter 200 and the number of zero bits, or may receive the information from the transmitter 200.

The descrambler 1190 descrambles an output value of the depadder 1180. Specifically, the descrambler 1190 is a component corresponding to the scrambler 250 of the transmitter 200, and performs an operation corresponding to that of the scrambler 250. That is, the descrambler 1190 may derandomize the segmented L1 post signaling bits output from the depadder 1180, and may output the derandomized L1 post signalings to the combiner 1195.

Since the transmitter 200 segments an L1 post signaling, processes the plurality of segmented L1 post signalings, and transmits the L1 post signalings to the receiver 1100 as described above, the multiplexer 1120, the deinterleaver 1140, the depuncturer 1150, the parity deinterleaver 1160, the LDPC decoder 1130, the BCH decoder 1170, the depadder 1180, and the descrambler 1190 provided in the receiver 1100 may be implemented in a plural number, and thus, may generate the plurality of segmented L1 post signalings.

The combiner 1195 may desegment an output value of the descrambler 1380.

Specifically, the combiner 1195 is a component corresponding to the segmenter 240 of the transmitter 200, and may perform an operation corresponding to that of the segmenter 240. That is, the combiner 1195 may desegment a plurality of segmented L1 post signalings, thereby generating a same L1 post signaling as that before being segmented.

The receiver 1100 shown in FIG. 12 may receive signals from the transmitter 200 including the components shown in FIG. 4, and may process the signals. However, when the transmitter 200 is implemented as shown in FIG. 10, the receiver 1100 may be implemented as shown in FIG. 13.

Figure 13:
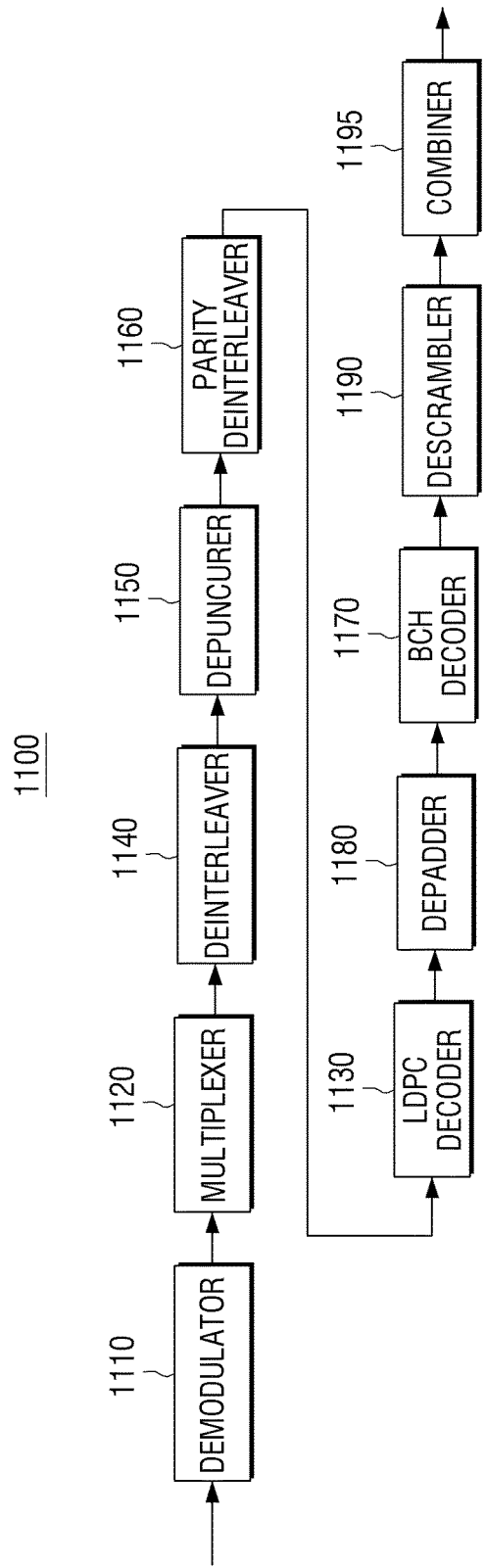
FIG. 13 is a block diagram to illustrate a detailed configuration of a receiver, according to another exemplary embodiment.

FIG. 13 is a block diagram to illustrate a detailed configuration of a receiver, according to another exemplary embodiment. Referring to FIG. 13, the receiver 1100 includes a demodulator 1110, a mux 1120, a deinterleaver 1140, a depuncturer 1150, a parity deinterleaver 1160, an LDPC decoder 1130, a depadder 1180, a BCH decoder 1170, a descrambler 1190, and a combiner 1195.

The components of the receiver 1100 of FIG. 13 are different from those of FIG. 12 in their arrangements, and perform the same operations and use the same parameters as in FIG. 12. Accordingly, the above-described difference will be explained.

The LDPC decoder 1130 may output bits which are generated as a result of decoding to the depadder 1180. In this case, bits input to the depadder 1180 may be formed of segmented L1 post signalings, zero bits padded to the segmented L1 post signalings, and BCH parity bits.

The depadder 1180 may remove the zero bits from bits output from the LDPC decoder 1130, and may output the bits to the BCH decoder 1170. In this case, bits output from the depadder 1180 may be formed of the segmented L1 post signalings and the BCH parity bits.

The BCH decoder 1170 performs BCH decoding with respect to bits output from the depadder 1180, and corrects an error on the segmented L1 post signalings, and may output the error-corrected bits to the descrambler 1190.

FIG. 14 is a flowchart to illustrate a signal processing method of a transmitter, according to an exemplary embodiment.

First, the transmitter generates an LDPC codeword by performing LDPC encoding with respect to L1 post signaling (S1410).

Specifically, the LDPC encoding may be performed based on a parity check matrix which includes an information word sub matrix and a parity sub matrix. In this case, the information word sub matrix includes a plurality of column groups each including 360 columns, and locations of 1 in the $0^{th}$ column of each of the plurality of column groups may be defined as shown in Table. 2

The transmitter demultiplexes bits constituting an LDPC codeword (S1420), and modulates the demultiplexed bits (S1430).

Specifically, in operation S1420, the transmitter may demultiplex the LDPC codeword by outputting the bits of the LDPC codeword to a plurality of sub frames. In this case, in operation S1420, the transmitter may determine the sub streams for demultiplexing the bits of the LDPC codeword based on Table 3.

FIG. 15 is a flowchart to illustrate a signal processing method of a receiver, according to an exemplary embodiment.

First, the receiver receives and demodulates a signal transmitted from a transmitter (1510). Here, the received signal includes an L1 post signalings which is LDPC-encoded. Specifically, the receiver generates a value corresponding to an LDPC codeword by demodulating the received signal, and multiplexes the demodulated value corresponding to the LDPC codeword (1520). Here, the demodulated value which is multiplexed may refer to a plurality of bits constituting the LDPC encoded L1 post signaling in a form of a plurality of sub streams, and, by the multiplexing, the receiver may generate a single stream of the LDPC encoded L1 post signaling. Next, the receiver performs LDPC decoding on the multiplexed value to correct an error (1530). In performing the LDPC decoding, a parity check matrix may be used. As a result of the LDPC decoding, the L1 post signaling in which the error is corrected is generated.

A non-transitory computer readable medium, which stores a program for performing the signal processing method according to the above exemplary embodiments, may be provided. The non-transitory computer readable medium refers to a medium that stores data semi-permanently rather than storing data for a very short time, such as a register, a cache, and a memory, and is readable by an apparatus. Specifically, the above-described various applications or programs may be stored in a non-transitory computer readable medium such as a compact disc (CD), a digital versatile disk (DVD), a hard disk, a Blu-ray disk, a universal serial bus (USB), a memory card, and a read only memory (ROM), and may be provided.

The components, modules or units represented by a block as illustrated in FIGS. 2, 4 and 10-13 may be embodied as various numbers of hardware, software and/or firmware structures that execute respective functions described above, according to an exemplary embodiment. For example, these components, modules or units may use a direct circuit structure, such as a memory, processing, logic, a look-up table, etc. that may execute the respective functions through controls of one or more microprocessors or other control apparatuses. Also, these components, modules or units may be specifically embodied by a program or a part of code, which contains one or more executable instructions for performing specified logic functions. Also, at least one of these components, elements, modules or units may further include a processor such as a central processing unit (CPU) that performs the respective functions, a microprocessor, or the like. Although a bus is not illustrated in the above block diagrams of FIGS. 2, 4 and 10-13, communication between the respective blocks may be performed via the bus.

The foregoing exemplary embodiments and advantages are merely exemplary and are not to be construed as limiting the present inventive concept. The exemplary embodiments can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A television (TV) broadcast signal transmitting apparatus comprising:
 a low density parity check (LDPC) encoder configured to encode input bits to generate parity bits, wherein the input bits are based on TV broadcast data;
 a demux configured to demultiplex bits of an LDPC codeword comprising the input bits and the parity bits according to a modulation format;
 a modulator configured to map the demultiplexed bits of the LDPC codeword to modulation symbols;
 a signal generator configured to generate a TV broadcast signal based on the modulation symbols using orthogonal frequency division (OFDM) processing; and
 a transmitter configured to transmit the generated TV broadcast signal to a receiver,
 wherein the demux is configured to demultiplex the LDPC codeword based on a table below:

| modulation format | 16-QAM | 64-QAM | 256-QAM |
|---|---|---|---|
| input bit-number, di mod $\eta_{MOD}$ | 0 1 2 3 | 0 1 2 3 4 5 | 0 1 2 3 4 5 6 7 |
| Output bit-number, e | 0 2 1 3 | 2 0 1 3 4 5 | 4 2 0 1 3 5 6 7, | where di is an index of the bits of the LDPC codeword, $\eta_{MOD}$ is a number of bits of each of the modulation symbols, and e is an index of the demultiplexed bits of the LDPC codeword.

2. The transmitting apparatus of claim 1, wherein the LDPC encoder performs the encoding based on a parity check matrix comprising an information word sub matrix and a parity sub matrix.

3. The transmitting apparatus of claim 2, wherein the information word sub matrix comprises a plurality of column groups each comprising 360 columns, and a location of a value 1 in a first column of each of the plurality of column groups is defined as in a following table:

| i | Indexes of rows where 1 is located in a 0th column of the ith column group |
|---|---|
| 0 | 432 655 893 942 1285 1427 1738 2199 2441 2565 2932 3201 4144 4419 4678 4963 5423 5922 6433 6564 6656 7478 7514 7892 |
| 1 | 220 453 690 826 1116 1425 1488 1901 3119 3182 3568 3800 3953 4071 4782 5038 5555 6836 6871 7131 7609 7850 8317 8443 |
| 2 | 300 454 497 930 1757 2145 2314 2372 2467 2819 3191 3256 3699 3984 4538 4965 5461 5742 5912 6135 6649 7636 8078 8455 |
| 3 | 24 65 565 609 990 1319 1394 1465 1918 1976 2463 2987 3330 3677 4195 4240 4947 5372 6453 6950 7066 8412 8500 8599 |
| 4 | 1373 4668 5324 7777 |
| 5 | 189 3930 5766 6877 |
| 6 | 3 2961 4207 5747 |
| 7 | 1108 4768 6743 7106 |
| 8 | 1282 2274 2750 6204 |
| 9 | 2279 2587 2737 6344 |
| 10 | 2889 3164 7275 8040 |
| 11 | 133 2734 5081 8386 |
| 12 | 437 3203 7121 |
| 13 | 4280 7128 8490 |
| 14 | 619 4563 6206 |
| 15 | 2799 6814 6991 |
| 16 | 244 4212 5925 |
| 17 | 1719 7657 8554 |
| 18 | 53 1895 6685 |
| 19 | 584 5420 6856 |
| 20 | 2958 5834 8103. |

4. The transmitting apparatus of claim 1, wherein the demux demultiplexes the bits of the LDPC codeword to a plurality of sub streams.

5. The transmitting apparatus of claim 4, wherein the demux demultiplexes the bits of the LDPC codeword by dividing the bits of the LDPC codeword into a plurality of bit groups and outputting the plurality of bit groups to the plurality of sub streams, respectively.

6. The transmitting apparatus of claim 4, wherein bits having a same index in the plurality of sub streams constitute a same cell.

7. The transmitting apparatus of claim 6, wherein a number of the plurality of sub streams is equal to a number of bits of a cell.

8. A signal processing method of a television (TV) broadcast signal transmitter, the method comprising:
 encoding input bits to generate parity bits based on a low density parity check (LDPC) code, wherein the input bits are based on TV broadcast data;
 demultiplexing bits of an LDPC codeword comprising the input bits and the parity bits;
 mapping the demultiplexed bits of the LDPC codeword to modulation symbols;
 generating a TV broadcast signal based on the modulation symbols using orthogonal frequency division (OFDM) processing; and
 transmitting the generated TV broadcast signal to a receiver,
 wherein the demultiplexing demultiplex the LDPC codeword based on a table below:

| modulation format | 16-QAM | 64-QAM | 256-QAM |
|---|---|---|---|
| input bit-number, di mod $\eta_{MOD}$ | 0 1 2 3 | 0 1 2 3 4 5 | 0 1 2 3 4 5 6 7 |
| Output bit-number, e | 0 2 1 3 | 2 0 1 3 4 5 | 4 2 0 1 3 5 6 7, | where di is an index of the bits of the LDPC codeword, $\eta_{MOD}$ is a number of bits of each of the modulation symbols, and e is an index of the demultiplexed bits of the LDPC codeword.

9. The method of claim 8, wherein the encoding encode the input bits based on a parity check matrix comprising an information word sub matrix and a parity sub matrix.

10. The method of claim 9, wherein the information word sub matrix comprises a plurality of column groups each comprising 360 columns, and a location of a value 1 in a first column of each of the plurality of column groups is defined as in a following table:

| i | Indexes of rows where 1 is located in a 0th column of the ith column group |
|---|---|
| 0 | 432 655 893 942 1285 1427 1738 2199 2441 2565 2932 3201 4144 4419 4678 4963 5423 5922 6433 6564 6656 7478 7514 7892 |
| 1 | 220 453 690 826 1116 1425 1488 1901 3119 3182 3568 3800 3953 4071 4782 5038 5555 6836 6871 7131 7609 7850 8317 8443 |
| 2 | 300 454 497 930 1757 2145 2314 2372 2467 2819 3191 3256 3699 3984 4538 4965 5461 5742 5912 6135 6649 7636 8078 8455 |
| 3 | 24 65 565 609 990 1319 1394 1465 1918 1976 2463 2987 3330 3677 4195 4240 4947 5372 6453 6950 7066 8412 8500 8599 |
| 4 | 1373 4668 5324 7777 |
| 5 | 189 3930 5766 6877 |
| 6 | 3 2961 4207 5747 |
| 7 | 1108 4768 6743 7106 |
| 8 | 1282 2274 2750 6204 |
| 9 | 2279 2587 2737 6344 |
| 10 | 2889 3164 7275 8040 |
| 11 | 133 2734 5081 8386 |
| 12 | 437 3203 7121 |
| 13 | 4280 7128 8490 |
| 14 | 619 4563 6206 |
| 15 | 2799 6814 6991 |
| 16 | 244 4212 5925 |
| 17 | 1719 7657 8554 |
| 18 | 53 1895 6685 |
| 19 | 584 5420 6856 |
| 20 | 2958 5834 8103. |

11. The method of claim 8, wherein the demultiplexing demultiplexes the bits of the LDPC codeword to a plurality of sub streams.

12. The method of claim 11, wherein the demultiplexing demultiplexes the bits of the LDPC codeword by dividing the bits of the LDPC codeword into a plurality of bit groups and outputting the plurality of bit groups to the plurality of sub streams, respectively.

13. The method of claim 11, wherein bits having a same index in the plurality of sub streams constitute a same cell.

14. The method of claim 13, wherein a number of the plurality of sub streams is equal to a number of bits of a cell.

15. A television (TV) broadcast signal receiver comprising:
a demodulator configured to receive and demodulate modulation symbols including a low density parity check (LDPC) codeword, wherein the modulation symbols were received from a TV broadcast signal transmitted by a transmitter;
a multiplexer configured to multiplex a plurality of bits of the LDPC codeword; and
an LDPC decoder configured to decode the multiplexed bits, wherein the decoded bits are based on TV broadcast data,
wherein the LDPC codeword was demultiplexed at the transmitter based on a following table:

| modulation format | 16-QAM | | | | 64-QAM | | | | | | 256-QAM | | | | | | | |
|---|---|---|---|---|---|---|---|---|---|---|---|---|---|---|---|---|---|---|
| input bit-number, di mod $\eta_{MOD}$ | 0 | 1 | 2 | 3 | 0 | 1 | 2 | 3 | 4 | 5 | 0 | 1 | 2 | 3 | 4 | 5 | 6 | 7 |
| Output bit-number, e | 0 | 2 | 1 | 3 | 2 | 0 | 1 | 3 | 4 | 5 | 4 | 2 | 0 | 1 | 3 | 5 | 6 | 7, | where di is an index of bits of the LDPC codeword, $\eta_{MOD}$ is a number of bits of each of the modulation symbols, and e is an index of demultiplexed bits of the LDPC codeword.

16. The receiver of claim 15, wherein the LDPC decoder decodes the multiplexed bits based on a parity check matrix comprising an information word sub matrix and a parity sub matrix, and wherein the information word sub matrix comprises a plurality of column groups each comprising 360 columns, and a location of a value 1 in a first column of each of the plurality of column groups is defined as in a following table:

| i | Indexes of rows where 1 is located in a 0th column of the ith column group |
|---|---|
| 0 | 432 655 893 942 1285 1427 1738 2199 2441 2565 2932 3201 4144 4419 4678 4963 5423 5922 6433 6564 6656 7478 7514 7892 |
| 1 | 220 453 690 826 1116 1425 1488 1901 3119 3182 3568 3800 3953 4071 4782 5038 5555 6836 6871 7131 7609 7850 8317 8443 |
| 2 | 300 454 497 930 1757 2145 2314 2372 2467 2819 3191 3256 3699 3984 4538 4965 5461 5742 5912 6135 6649 7636 8078 8455 |
| 3 | 24 65 565 609 990 1319 1394 1465 1918 1976 2463 2987 3330 3677 4195 4240 4947 5372 6453 6950 7066 8412 8500 8599 |
| 4 | 1373 4668 5324 7777 |
| 5 | 189 3930 5766 6877 |
| 6 | 3 2961 4207 5747 |
| 7 | 1108 4768 6743 7106 |
| 8 | 1282 2274 2750 6204 |
| 9 | 2279 2587 2737 6344 |
| 10 | 2889 3164 7275 8040 |
| 11 | 133 2734 5081 8386 |
| 12 | 437 3203 7121 |
| 13 | 4280 7128 8490 |
| 14 | 619 4563 6206 |
| 15 | 2799 6814 6991 |
| 16 | 244 4212 5925 |
| 17 | 1719 7657 8554 |
| 18 | 53 1895 6685 |
| 19 | 584 5420 6856 |
| 20 | 2958 5834 8103. |

17. The receiver of claim 15, wherein the multiplexer multiplexes the plurality of bits, which are included in a plurality of sub streams, into a single stream.

* * * * *